United States Patent
Minakuti et al.

(10) Patent No.: US 6,694,503 B2
(45) Date of Patent: Feb. 17, 2004

(54) PROCESSING DEVICE AND METHOD OF PROCESSING MATERIAL WITH ULTRAVIOLET LIGHT OR LIGHT OF SHORTER WAVELENGTH THAN ULTRAVIOLET LIGHT

(75) Inventors: Jun Minakuti, Sakai (JP); Osamu Tabata, Shiga-Ken (JP); Koji Yamamoto, Kawanishi (JP)

(73) Assignees: Gakkohojin Ritsumeikan, Kyoto (JP); Minolta Co., Ltd., Osaka (JP)

( * ) Notice: Subject to any disclaimer, the term of this patent is extended or adjusted under 35 U.S.C. 154(b) by 429 days.

(21) Appl. No.: 09/773,909

(22) Filed: Feb. 2, 2001

(65) Prior Publication Data

US 2001/0012696 A1 Aug. 9, 2001

(30) Foreign Application Priority Data

Feb. 3, 2000  (JP) ........................................ 2000-026462
Feb. 3, 2000  (JP) ........................................ 2000-026463

(51) Int. Cl.[7] ....................... G06F 17/50; H01L 21/302; H01L 21/462
(52) U.S. Cl. ............................. 716/19; 716/20; 716/21; 438/707; 438/708; 438/795
(58) Field of Search ............................. 716/19, 21, 20, 716/1; 438/707, 795, 708; 250/492.1, 492.22, 492.23

(56) References Cited

FOREIGN PATENT DOCUMENTS

| JP | 6-264272 | | 9/1994 | | |
|----|----------|---|--------|---|---|
| JP | 406264272 A | * | 9/1994 | ......... | H01L/21/302 |
| JP | 408264511 A | * | 10/1996 | ......... | H01L/21/302 |
| JP | 2000-35500 | | 2/2000 | | |
| JP | 02000035500 A | * | 2/2000 | ......... | H01L/21/027 |

OTHER PUBLICATIONS

Takagi et al., "Photoforming Applied to Fine Machining", Feb. 1993, IEEE MEMS Proceedings, pp. 173–178.*
Ezaki et al., "Surgace Modification of III–V Compound Semiconductor Using Surface Electromagnetic Wave Etching Induced by Ultraviolet lasers", Sep. 1995, IEEE Journal on Selected Topics in Quantum Elctronics, pp. 841–847.*
Brown, "Lithography:Laser and Optics, What else ids there?", May 1998, Summaries of papers presented at conference on Las and Electro–OPtics, Technical Digest pp. 84–85.*
You et al., "Deep X–ray Exposure System with Multistage for 3D Microfabrication", Oct. 2000, IEEE Proceedings of 2000 International Symposium on Micromechatronics and Human Science, pp. 53–58.*

* cited by examiner

Primary Examiner—Leigh M. Garbowski
Assistant Examiner—Sun James Lin
(74) Attorney, Agent, or Firm—McDermott, Will & Emery

(57) ABSTRACT

For allowing processing of a material into an intended three-dimensional configuration having different processed depths while suppressing an influence exerted on a processed configuration by a configuration of a transparent portion, a processing device includes an SR light source 1 for emitting SR light, an X-ray mask having a transparent portion of a predetermined configuration for passing the X-rays emitted from the SR light source 1, and exposure stage 3 for oscillating the X-ray mask and the material relatively to each other in accordance with a movement pattern determined based on the processing configuration of the processing material for moving the X-ray mask and the material relatively to each other and thereby oscillating the region where the material is irradiated with the X-ray passed through the transparent opening.

20 Claims, 26 Drawing Sheets

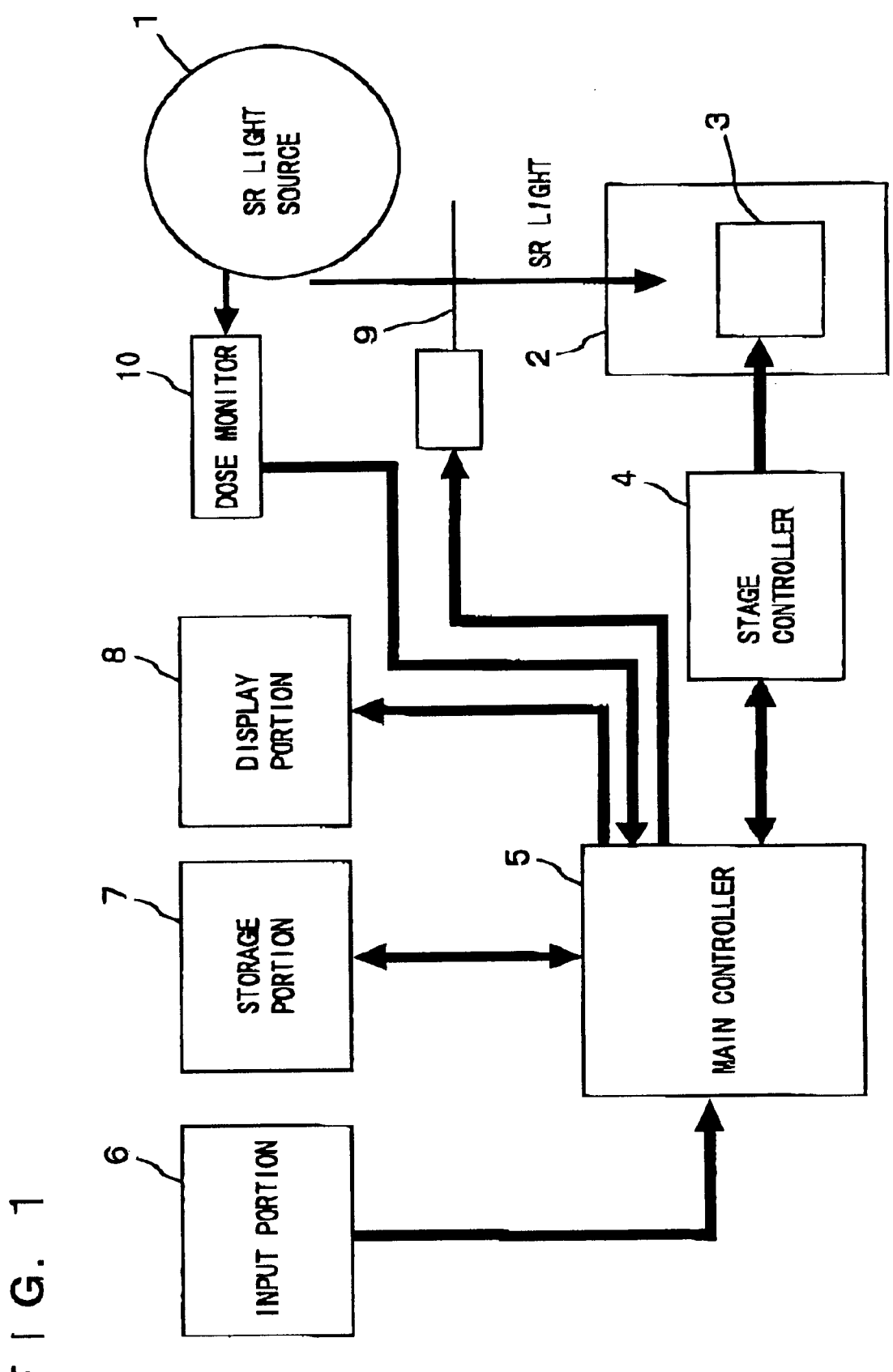
F I G. 1

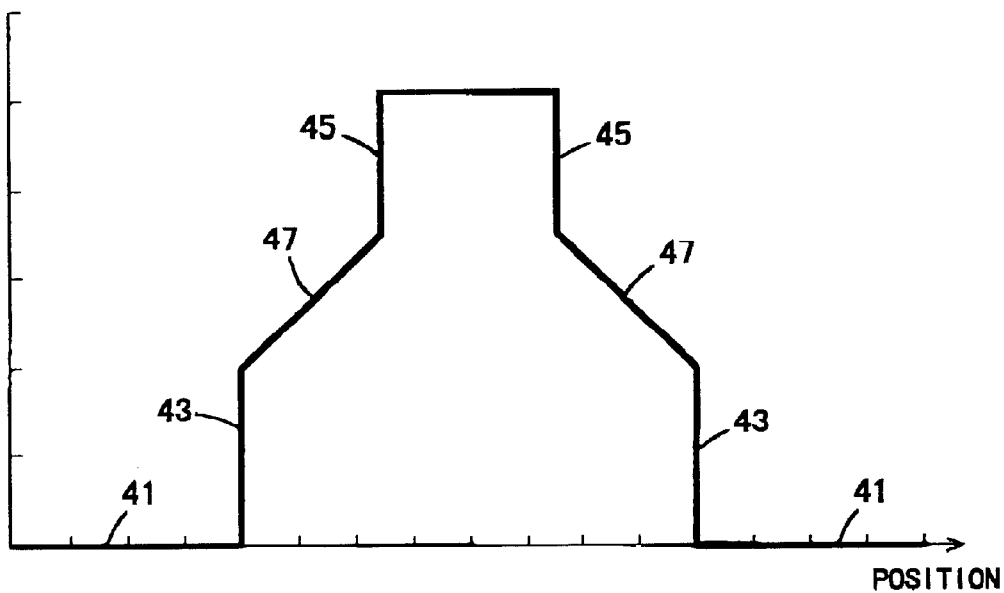
F I G. 3

F I G. 8
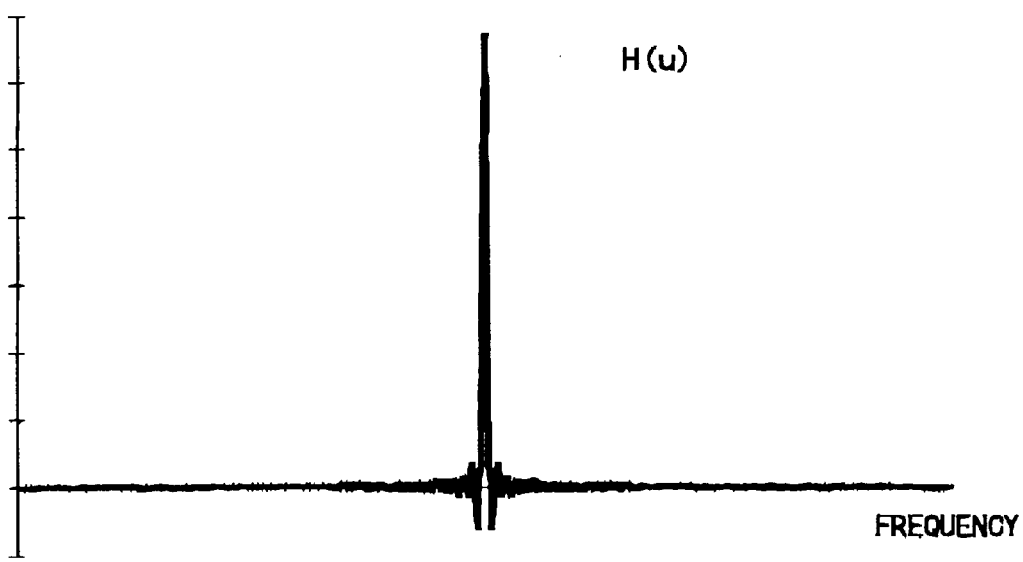
F I G. 9
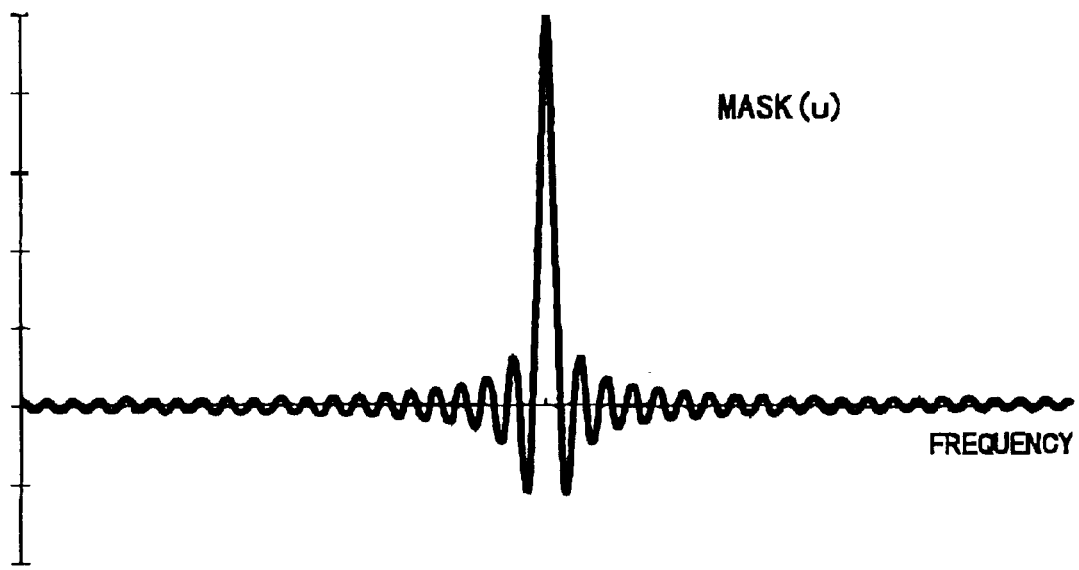

UNIT: μm

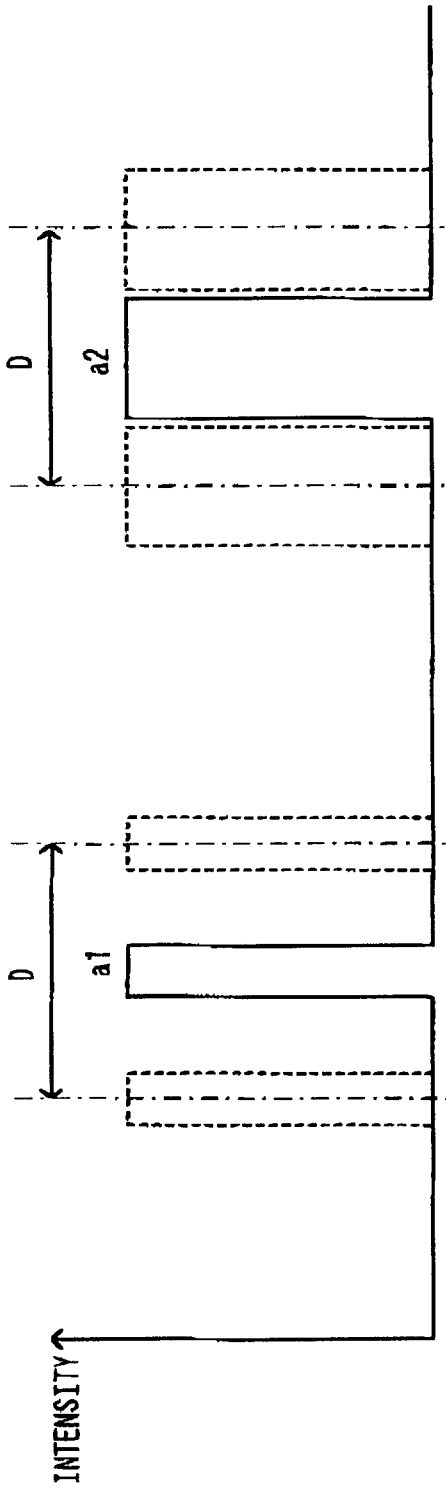
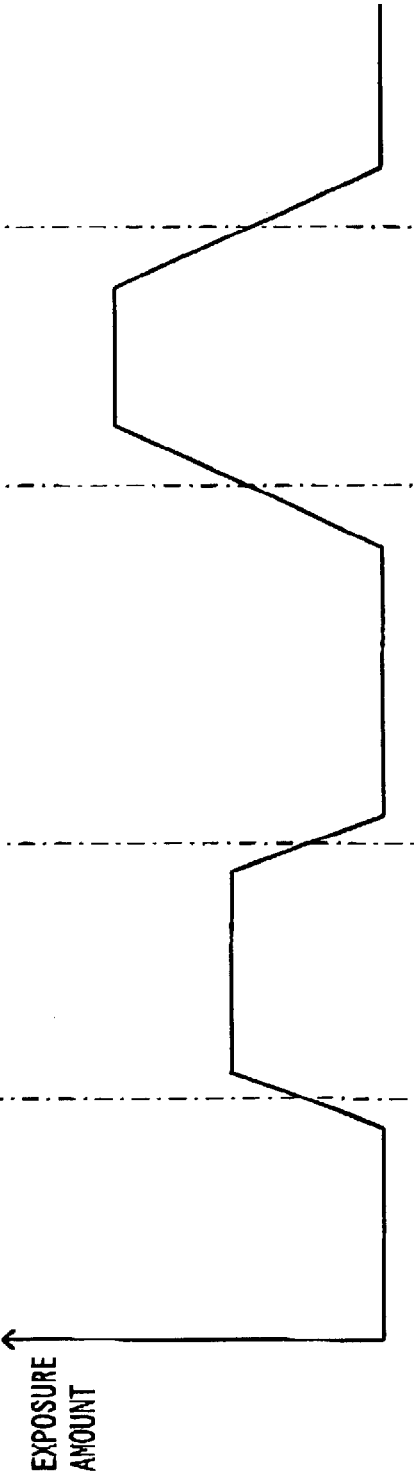
FIG. 29A
FIG. 29B

PROCESSING DEVICE AND METHOD OF PROCESSING MATERIAL WITH ULTRAVIOLET LIGHT OR LIGHT OF SHORTER WAVELENGTH THAN ULTRAVIOLET LIGHT

The application is based on application Nos. 2000-26462 and 2000-26463 filed in Japan, the contents of which are hereby incorporated by reference.

BACKGROUND OF THE INVENTION

1. Field of the Invention

The present invention relates to a processing device and a processing method for processing a material with ultraviolet light or light having a shorter wavelength than the ultraviolet light. In particular, the invention relates to a processing device and a processing method for effecting fine processing to produce a three-dimensional part by irradiating a material with ultraviolet light or light of a shorter wavelength than the ultraviolet light and thereby removing the material, or changing physical or chemical properties of the material.

2. Description of the Related Art (1) First Disadvantage

It has been demanded to provide a method of processing works or materials with high accuracy to produce finely processed parts such as components of micro-machines. Photolithography and others, which are used for manufacturing semiconductor integrated circuits, have been known as some kinds of fine processing method. The fine processing technique used for manufacturing the semiconductor integrated circuits is primarily a technique for arranging parts by layering a thin film on a two-dimensional plane. The technique can arrange a layer of only up to several micrometers in thickness. Therefore, this technique cannot be used for manufacturing a part having a three-dimensional structure, which requires processing on the order of tens to hundreds of micrometers in depth.

An LIGA method using X-rays by synchrotron radiation has been known as a fine processing method, which allows processing on the order of tens to hundreds of micrometers in depth. The LIGA method was developed in Germany, and "LIGA" is an abbreviation for German "Lithographie (lithography)", "Galvanoformung (electro-forming)" and "Abformung (forming)". The LIGA method is a technology utilizing a high rectilinear property and a high energy of X-rays.

In the LIGA method, resist made of polymethyl methacrylate, which will be referred to as "PMMA" hereinafter, is applied to a surface of a substrate to form a layer of hundreds of micrometers in thickness, and is irradiated with X-rays to cut of molecular chains of the resist. Then, development is performed to remove the resist from exposed portions. Using the remaining resist as a die, electro-casting is performed to form a structure of metal. Molding of plastics or the like can be performed using this metal structure as a die. Thereby, accurately and finely processed parts can be manufactured in large volume.

According to the LIGA method, a process of exposing a material uses a mask-having a transparent portion transparent to X-rays for restricting a region of the resist irradiated with X-rays. Since X-rays have a high rectilinear property, the region on the resist irradiated with X-rays has the same configuration as the transparent portion. Accordingly, the mask having the transparent portion of the same configuration as the processing configuration (i.e., configuration to be produced by the processing) is used.

As described above, the LIGA method can produce the three-dimensional structure, which has a uniform section perpendicular to the incident direction of X-rays as well as a thickness of hundreds of micrometers.

However, the conventional LIGA method uses the mask having the transparent portion of the same configuration as the intended process configuration. Therefore, it is impossible to produce a three-dimensional structure, of which section perpendicular to the incident direction of X-rays varies depending on the depth In view of this, such a manner may be envisaged that an X-ray mask having a transparent portion of a smaller configuration than the process configuration is employed, and is moved relatively to the resist so that the resist may be exposed to the X-rays in accordance with an exposure amount distribution corresponding to the process configuration.

However, the configuration of the transparent portion of X-ray mask does not match with the configuration of the section perpendicular to the incident direction of X-rays, and further a processing amount of the resist (i.e., an amount by which the resist is processed) in the depth direction varies depending on the position. Therefore, it is difficult to determine the pattern of movement of the X-ray mask so that the exposure amount distribution may correspond to the intended three-dimensional processing configuration. Accordingly, it is difficult to produce the three-dimensional structure, of which section perpendicular to the incident direction of X-ray varies in configuration depending on the depth.

(2) Second Disadvantage

In the prior art, nozzle bores, which are provided in an ink-jet record head for ejecting ink, are formed by press work, electro-casting, laser processing or the like. According to the press work, a nozzle plate is pressed and deformed by dies for forming the nozzle bores. This usually causes large errors during processing in the configurations of nozzle bores, and thus causes large variations in configuration. The electro-casting method is performed with a die formed of a resist pattern prepared by photolithography so that a nozzle plate having nozzles is directly prepared. In this electro-casting method, the processible sectional form of the nozzle bore is restricted, and the error in resist pattern directly affects the configuration of the nozzle plate. According to the laser processing method, the processible sectional form of the nozzle bore is restricted to only the vertical form, Further, an error occurs in the peripheries of nozzle bores during processing, resulting in variations in configurations of the nozzle bores.

According to the conventional manufacturing method, it is difficult to achieve both kinds of processing described above, i.e., the processing for producing a three-dimensional configuration, which has a processed depth varying depending on the position, and is employed, e.g., in the nozzle bore for ejecting ink in the inkjet record head, and the processing in which variations in configuration between the processed portions are suppressed.

If an error is present in configuration of the nozzle bore, and/or variations are present in configuration between the nozzle bores, the respective nozzles have different ink ejection characteristics. The ink ejection characteristics relate to a volume of ejected ink and an ejection speed. If variations are present in ink ejection characteristics between the nozzles, inconsistencies in density occur in printed portions. Particularly, in an ink-jet record head provided with a row of many nozzles, the ink-jet record head is scanned on a record medium in a direction perpendicular to the row of nozzles for printing so that inconsistencies in density between the nozzles result in stripes along the scanning paths. The stripe noises are conspicuous in many cases, and therefore remarkably lower image quantities. For printing beautiful images with less noises, it is very important to keep uniformity in ink ejection characteristics between the nozzles.

Methods such as photolithography used for producing a semiconductor integrated circuit are also know as the fine processing methods, which can perform extremely accurate and fine processing of parts such as an ink-jet record head provided with nozzle bores to be processed, In this fine processing technique used for manufacturing the semiconductor integrated circuit, parts are arranged primarily by layering a thin layer on a two-dimensional plane. This technique can arrange the layer of only several micrometers in thickness. Thus, this technique cannot be used for manufacturing parts having three-dimensional structures, which must have sizes in depth direction on the order from tens to hundreds of micrometers.

The foregoing LIGA method is known as a fine processing method, which allows processing on the order from tens to hundreds of micrometers in the depth direction.

In the LIGA method, however, it is difficult to change the processing amount in the height direction during the one processing operation. This is because the exposure distribution of the material to be processed must be changed for changing the processing amount in the height direction. For this change, it is necessary to change a transmittance of the transparent opening of the mask. However, there is no technique that can produce such masks with a high accuracy. Accordingly, the exposure is performed multiple times with a combination of plurality of masks, or exposure and etching are repeated multiple times. However, the method in which the exposure is performed several times suffers from such a problem that the material to be processed and the mask must be positioned accurately every time the exposure is to be performed, and an error in position causes a large error in the processed configuration.

A mask, which is used in the LIGA method, is prepared, e.g., by the photolithography and electro-casting. The transparent portions of the mask thus prepared may have a configuration different from the designed configuration due to error in manufacturing in some cases. For example, if the transparent portion has a circular form, irregularities may be present in the circle of the periphery of the transparent portion. Further, the side surface of the transparent portion may not be parallel to the direction of X-rays, resulting in fine irregularities. These errors in the mask impede accurate processing.

SUMMARY OF THE INVENTION

The invention has been developed for overcoming the above disadvantages, and an object of the invention is to provide a processing device and a processing method, which allow easy processing of a material into an intended three-dimensional configuration.

Another object of the invention is to provide a processing device and a processing method, which allow processing of a material into an intended three-dimensional configuration having different processed depths while suppressing an influence exerted on a processed configuration by an error in configuration of a transparent portion.

Still another object of the invention is to provide a processing device and a processing method, which allow easy processing of a material into a configuration having portions of different processed amounts.

According to an aspect of the invention for achieving the above objects, the invention provides a processing device of processing a material by irradiating the material with ultraviolet light or light of a shorter wavelength than the ultraviolet light to remove the material, or to change physical or chemical properties of the material, including a light source for emitting the ultraviolet light or the light of the shorter wavelength than the ultraviolet light, a mask having a transparent portion of a predetermined configuration for passing the light emitted from the light source, an input portions for entering a processing configuration formed of a position on a plane of said material and a processing amount, a memory for storing a relationship between the exposure amount of the material and the processing amount, a converter for converting the processing configuration entered via the input portion into an effective exposure amount distribution formed of the position on the material plane and the exposure amount in accordance with the relationship between the exposure amount and the processing amount stored in the memory, a calculator for calculating a movement pattern for moving on the material plane an irradiation region for irradiation of the material with the light passed through the transparent portion based on the effective exposure amount distribution and the configuration of the transparent portion such that the exposure amount distribution of the material forms the effective exposure amount distribution, and a moving mechanism for moving the mask and the material relatively to each other in accordance with the calculated movement pattern.

According to the above aspect of the invention, the processing configuration which is entered through the input portion is converted into the effective exposure amount distribution formed of the position on the material plane and the exposure amount in accordance with the relationship between the exposure amount and the processing amount stored in the memory. Thereby, the effective exposure amount distribution, an intensity distribution of the light emitted to the irradiation region and the movement pattern become linear. Based on the effective exposure amount distribution and the configuration of the transparent portion, the movement pattern for moving the irradiation region on the material plane is calculated such that the exposure amount distribution of the material forms the effective exposure amount distribution. The irradiated portion and the material are moved relatively in accordance with the calculated movement pattern. Accordingly, the material is exposed in accordance with the effective exposure amount distribution. Thereby, it is possible to provide the processing device, which can easily process the material into an intended three-dimensional form.

According to another aspect, the invention provides a processing method of processing a material by irradiating the material with ultraviolet light or light of a shorter wavelength than the ultraviolet light to remove the material, or to change physical or chemical properties of the material, including the steps of emitting the ultraviolet light or the light of the shorter wavelength than the ultraviolet light to an irradiation region of a predetermined configuration, entering a processing configuration formed of a position on a plane of said material and a processing amount, converting the entered processing configuration into an effective exposure amount distribution formed of the position on the material plane and the exposure amount in accordance with a relationship between the exposure amount of the material and said processing amount, calculating a movement pattern for moving on the material plane the irradiation region based on the effective exposure amount distribution and the configuration of the irradiation region such that the exposure amount distribution of the material forms the effective exposure amount distribution, and moving the irradiation region and the material relatively to each other in accordance with the calculated movement pattern.

According to the above aspect of the invention, the entered processing configuration is converted into the effective exposure amount distribution formed of the position on the material plane and the exposure amount in accordance with the relationship between the exposure amount and the processing amount. Based on the effective exposure amount distribution and the configuration of the irradiation region, the movement pattern for moving the irradiation region on the material plane is calculated such that the exposure amount distribution of the material forms the effective exposure amount distribution. The irradiation region and the material are moved relatively in accordance with the calculated movement pattern. Accordingly, the material is exposed in accordance with the effective exposure amount distribution. Thereby, it is possible to provide the processing method, which allows easy processing of the material into an intended three-dimensional form.

According to still another aspect, the invention provides a processing device of processing a material by irradiating the material with ultraviolet light or light of a shorter wavelength than the ultraviolet light to remove the material, or to change physical or chemical properties of the material, including a light source for emitting the ultraviolet light or the light of the shorter wavelength than the ultraviolet light, a mask having a transparent portion of a predetermined configuration for passing the light emitted from the light source, a moving mechanism for moving the mask and the material relatively to each other in accordance with a movement pattern determined based on a processing configuration of the material, and an oscillating mechanism for oscillating the mask and the material relatively to each other for oscillating a region for irradiation of the material with the light passed through the transparent portion, wherein a speed of the oscillation by the oscillating mechanism is higher than a speed of movement by the moving mechanism.

According to the above aspect of the invention, the mask and the material are relatively oscillated for oscillating the region where the material is irradiated with the light passed through the transparent portion. Thereby, this region for irradiation of the material with the light passed through the transparent portion moves within a range of an amplitude of the oscillation. Accordingly, the configuration of the exposed region does not match with the configuration of the transparent portion, and matches with a configuration obtained by blurring the configuration of the transparent portion.

Since the mask and the material are moved relatively in accordance with the movement pattern determined on the basis of the processing configuration of the material, the material is exposed in accordance with the exposure distribution corresponding to the processing configuration. Therefore, the material can be processed into the three-dimensional configuration having different depths.

Since the oscillation speed of the oscillating mechanism is higher than the moving speed of the moving mechanism, the configuration of the exposed region is blued within the range of the amplitude, by which the configuration of the transparent portion oscillates. As a result, it is possible to provide the processing device, which can process the material into an intended three-dimensional configuration having different depths, and can suppress an influence exerted by the configuration of the transparent portion on the processing configuration.

According to yet another aspect, the invention provides a processing device of processing a material by irradiating the material with ultraviolet light or light of a shorter wavelength than the ultraviolet light to remove the material, or to change physical or chemical properties of the material, including a light source for emitting the ultraviolet light or the light of the shorter wavelength than the ultraviolet light, a mask having a plurality of transparent portions for passing the light emitted from the light source, and an oscillating mechanism for oscillating the mask and the material relatively to each other for oscillating a plurality of regions for irradiation of the material with the light passed through said plurality of transparent portions, wherein the plurality of transparent portions include the transparent portion occupying a unit area at a rate different from those of the other transparent portions.

According to this invention, the mask has the plurality of transparent portions for passing the light emitted from the light source, and the plurality of transparent portions include the transparent portion occupying a unit area at a rate different from those of the other transparent portions. The transparent portions, which include the transparent portion occupying a unit area at a rate different from those of the other transparent portions, pass the light to provide different exposure amounts, and therefore, can cause provide different processing amounts of the material, respectively. Consequently, it is possible to provide the processing device, which can produce the configuration having portions of different processed amounts by performing the exposure only one time.

The oscillation may include a sinusoidal wave, a rectangular wave and a triangular wave, and may also include two kinds of oscillations of different oscillation directions.

According to further another aspect, the invention provides a processing method of processing a material by irradiating the material with ultraviolet light or light of a shorter wavelength than the ultraviolet light to remove the material, or to change physical or chemical properties of the material, including the steps of emitting the ultraviolet light or the light of the shorter wavelength than the ultraviolet light to an irradiation region of a predetermined configuration, moving the irradiation region and the material relatively to each other in accordance with a movement pattern determined based on the processing configuration of the material, and oscillating the irradiation region and the material relatively to each other for oscillating the irradiation region on a plane of the material, wherein a speed of the oscillation in the oscillating step is higher than a speed of movement in the moving step.

According to the above aspect of the invention, the material can be processed into an intended three-dimensional configuration having different processing depths. Also, it is possible to provide the processing method, which can perform the processing while suppressing an influence exerted by the configuration of the irradiation region on the processing configuration.

According to a further aspect, the invention provides a processing method of processing a material by irradiating the material with ultraviolet light or light of a shorter wavelength than the ultraviolet light to remove the material, or to change physical or chemical properties of the material, including the steps of emitting the ultraviolet light or the light of the shorter wavelength than the ultraviolet light to a plurality of irradiation regions, and oscillating the plurality of irradiation regions and the material relatively to each other for oscillating the plurality of irradiation regions on a plane of the material, wherein the plurality of irradiation regions include the irradiation region occupying a unit area at a rate different from those of the other irradiation regions.

According to the above aspect of the invention, the irradiation regions, which occupy the unit areas at different rates, respectively, cause different exposure amounts in the regions where the irradiation regions move on the material plane, respectively, and therefore, can provide different processing amounts of the material, respectively. Consequently, it is possible to provide the processing method, which can produce the configuration having portions of different processed amounts by performing the exposure only one time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a schematic structure of a processing device of a first embodiment of the invention;

FIG. 3 shows an intended configuration;

FIG. 8 shows a function H(u) obtained by Fourier transformation of a function h(x) expressing the effective exposure amount distribution shown in FIG. 5;

FIG. 9 shows a function MASK(u) obtained by Fourier transformation of a function mask(x) expressing the X-ray transmittance distribution of the X-ray mask shown in FIG. 6;

FIGS. 29A and 29B show a relationship between an intensity distribution of transparent openings of different areas provided in an X-ray mask in a third embodiment and exposure amounts of the respective transparent openings;

DESCRIPTION OF THE PREFERRED EMBODIMENTS

Figure 2:
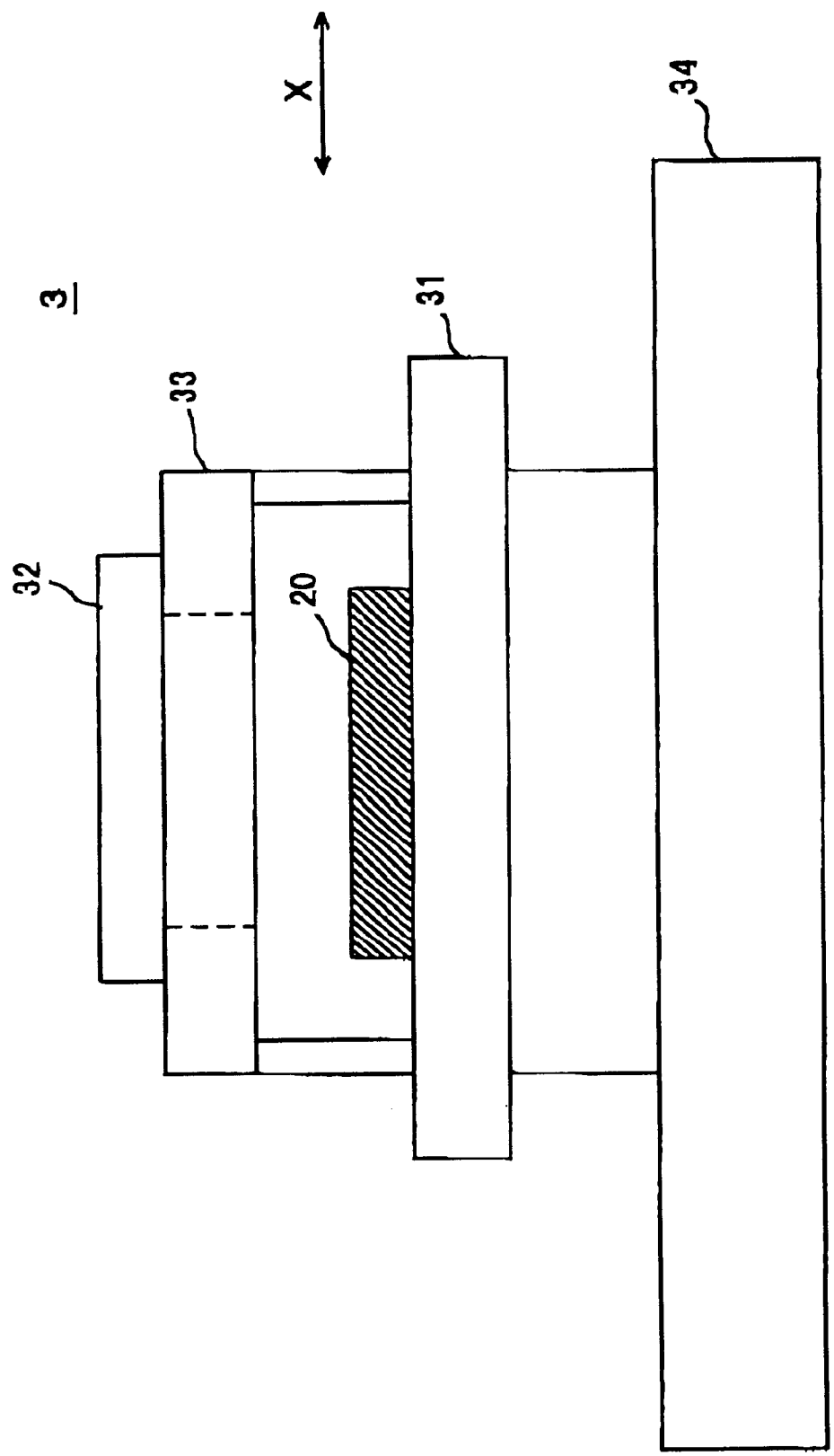
FIG. 2 is a side view of an exposure stage in the processing device of the first embodiment.

Description will now be given on processing devices of embodiments of the invention. The same or corresponding portions bear the same reference numbers, and description thereof is not repeated.

[First Embodiment]

Referring to FIG. 1, a processing device includes a main controller 5 for controlling the whole device as well as an input portion 6, a storage portion 7, a display portion 8 and a stage controller 4, which are connected to main controller 5. The processing device also includes an exposure stage 3 (i.e., stage for exposure), which is connected to stage controller, and can move a processing material (i.e., material to be processed) by a distance on the order of nanometers, a synchrotron radiation light source 1 (which will be referred to as an "SR light source" hereinafter) for emitting synchrotron radiation light (which will be referred to as an "SR light" hereinafter) to the processing material, and a dose monitor 10.

Input portion 6 is a device, through which an operator of the processing device enters a required instruction and/or required information. Storage portion 7 stores programs to be executed by main controller 5 as well as variables and others required for executing the programs.

Main controller 5, input portion 6, storage portion 7 and display portion 8 may be provided by a personal computer. In this case, a Central Processing Unit (CPU) of the personal computer forms main controller 5, and a keyboard and/or a mouse correspond to input portion 6. Further, a Read-Only Memory (ROM), a Random Access Memory (RAM) and a hard disk correspond to storage portion 7, and a display and a printer correspond to display portion 8.

The SR light emitted from SR light source 1 is filtered by a beryllium filter, a polyimide filter or the like, whereby X-rays of a predetermined wavelength can be extracted and supplied into an exposure chamber 2.

When a shutter 9 is closed, it intercepts the X-rays of SR light emitted from SR light source 1 so that the X-rays do not enter exposure chamber 2. When shutter 9 is open, the X-rays of SR light enter exposure chamber 2. Main controller 5 controls the opening and closing of shutter 9.

Dose monitor 10 monitors the intensity of X-rays of SR light emitted from SR light source 1 at appropriate times. The monitored intensity of X-rays is sent to main controller 5.

Exposure stage 3 is arranged within exposure chamber 2, and is driven under the control of stage controller 4. Stage controller 4 applies a drive voltage to exposure stage 3 in accordance with an instruction sent from main controller 5.

FIG. 2 is a side view of exposure stage 3. Referring to FIG. 2, exposure stage 3 includes a sample holder 31 for holding a processing material 20, an X-ray mask 32 which has a transparent opening of a predetermined configuration for passing the X-rays therethrough, a mask moving mechanism 33 for moving X-ray mask 32 with respect to processing material 20 along two horizontal axes, and a reciprocating mechanism 34 for reciprocating mask moving mechanism 33 and X-ray mask 32 along one horizontal axis.

X-ray mask 32 has a circular transparent opening, which allows passage of the X-rays of SR light emitted from SR light source 1. The transparent opening has a smaller area than a section of the processing configuration perpendicular to the incident direction of X-rays. Processing material 20 is formed by applying PMMA onto the substrate, and has a thickness of hundreds of millimeters.

Mask moving mechanism 33 is an X-Y stage allowing position control on the order of nanometers. Mask moving mechanism 33 uses piezoelectric elements (PZTs) as actuators, and moves X-ray mask 32 in the direction indicated by an arrow X in FIG. 2 and a direction Y perpendicular to the sheet of FIG. 2.

Mask moving mechanism 33 has a sensor for detecting a position of X-ray mask 32. The output of this sensor is fed back to the signal for driving the piezoelectric elements. Mask moving mechanism 33 may be formed of a stage of Model P-731.10 type manufactured by Physick Instrumente Co., Ltd.

Sample holder 31 holds processing material 20 and mask moving mechanism 33. Reciprocating mechanism 34 reciprocates sample holder 31 in direction X in FIG. 2 at a speed of 1 mm/second. The X-rays of SR light has an intensity exhibiting a smooth or gently-sloping distribution. In view of this, reciprocating mechanism 34 moves sample holder 31 so that the transparent opening of X-ray mask 32 moves through the entire area subjected to the X-rays. Thereby, the intensity distribution of X-rays passed through the transparent opening of X-ray mask 32 is corrected into a uniform form.

For achieving the above correction more reliably, reciprocating mechanism 34 which reciprocates sample holder 31 in direction X, may also reciprocate it in a direction Y (which will be referred to as a "direction Y", hereinafter) perpendicular to the sheet of the figure.

The drive voltage for driving the piezoelectric elements of mask moving mechanism 33 is applied from stage controller 4. The sensor for detecting the position of X-ray mask 32 sends its output to stage controller 4. Accordingly, stage controller 4 performs the control by feedback of the output of sensor to the signal for driving the piezoelectric elements.

Description will now be given on processing by the processing device shown in FIG. 1, and particularly processing for producing a nozzle plate, which is used in an ink ejecting portion of an ink-jet printer. In recent years, ink-jet printers capable of fast and high-quality printing have been demand. For this, it is necessary to increase the density of nozzles for ejecting the ink, and such a high-density nozzle structure requires a fine processing technique. Accordingly, the processing device of this embodiment is suitable to such processing.

Actual processing is performed by irradiating a two-dimensional region with X-rays. For simplicity reason, however, the following description will be given in connection with a one-dimensional region unless otherwise specified.

FIG. 3 shows an intended processing configuration. Referring to FIG. 3, the abscissa gives a position, and the ordinate gives a processing amount. The position and processing amount define the processing configuration. The intended processing configuration shown in FIG. 3 includes portions 43 and 45 parallel to the direction of X-rays (i.e., parallel to the longitudinal axis) as well as an inclined portion 47.

Figure 4:
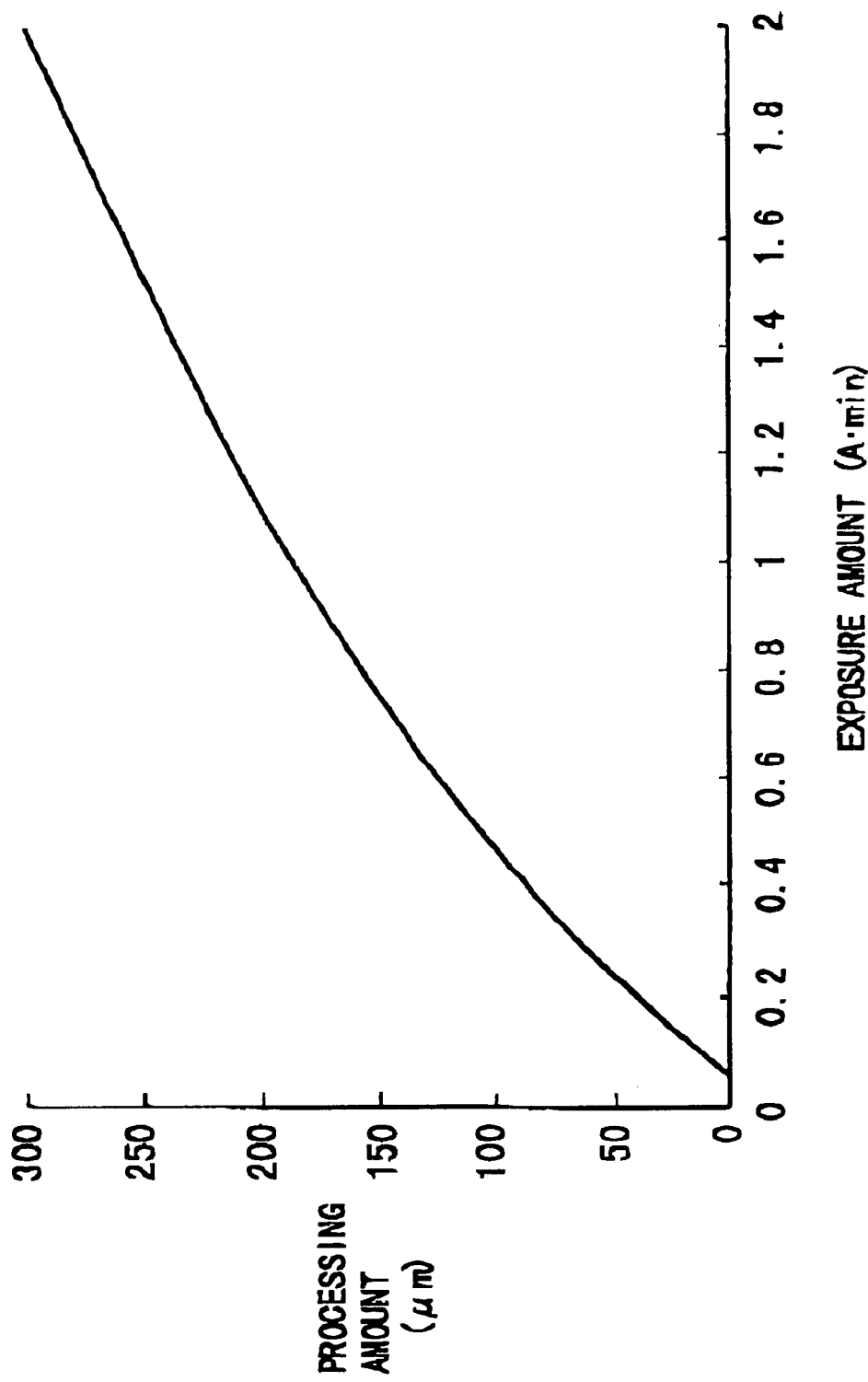
FIG. 4 shows a relationship between an exposure amount and a processing amount in the case where resist is made of PMMA.

A relationship between the exposure amount of the resist and the processing amount will now be described. FIG. 4 shows a relationship between the exposure amount and the processing amount in the case where the resist is made of PMMA. The relationship between the exposure amount and the processing amount shown in FIG. 4 was obtained by measuring a series of specimens, which were exposed with various exposure amounts under the same conditions prior to the processing. The processing amount was determined by measuring the amount of the PMMA, which was removed by developing the exposed PMMA. The development was performed at 40° C. for 120 minutes with a developer solution and a stopper solution having the following compositions.

(1) A GG developer solution was used. It contained, by volume, 60% of 2-(2-Butoxvethoxy) ethanol, 20% of morpholine, 5% of 2-Aminoethanol and 15% of water.

(2) The stopper solution contains, by volume, 80% of 2-(2-Butoxvethoxy) ethanol and 20% of water.

Referring to FIG. 4, the exposure amount and the processing amount are not in a linear relationship. Accordingly, the intended processing configuration cannot be achieved if the exposure is performed by moving X-ray mask 32 in accordance with the processing configuration. Accordingly, it is necessary to convert the processing amount into the exposure amount.

The relationship between the exposure amount and the processing amount shown in FIG. 4 is stored in storage portion 7 of the processing device. Storing portion 7 may store all the measured values in the form of digital data, or may store the measured values in the form of a function prepared by approximations. The relationship between the exposure amount and the processing amount may be entered immediately before the processing. Storage portion 7 may store in advance a data base containing the relationships, and the relationship may be selected by an instruction entered via input portion 6.

Figure 5:
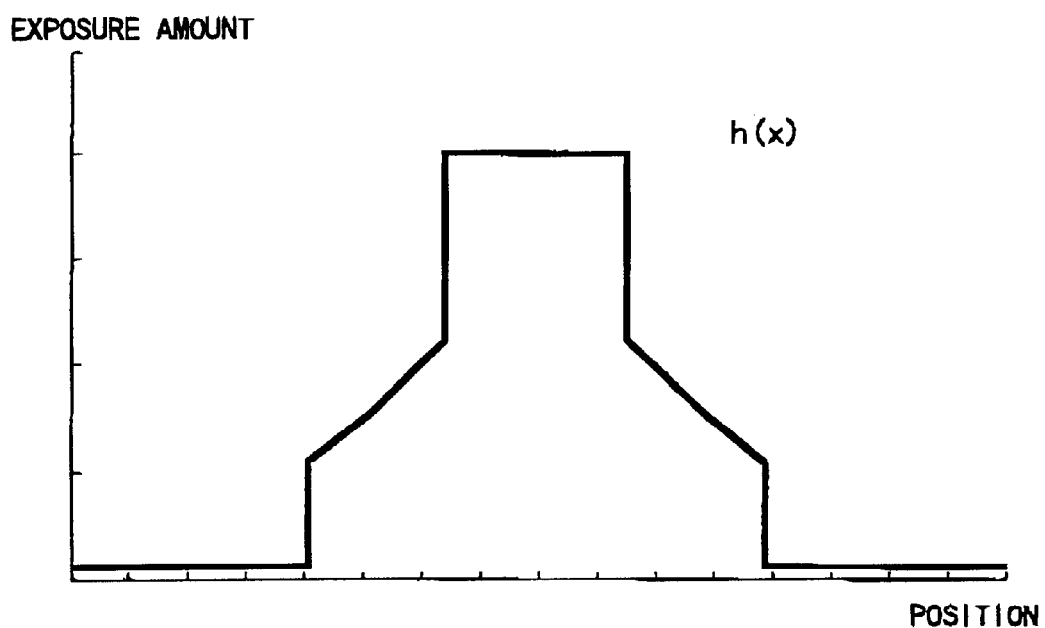
FIG. 5 shows an effective exposure amount distribution obtained by converting the intended configuration shown in FIG. 3 into an effective exposure amount.

In accordance with the relationship between the exposure amount and the processing amount shown in FIG. 4, the intended configurations, which are shown in FIG. 3, in the respective positions are converted into the effective exposure amounts, respectively. The effective exposure amount is an exposure amount which is required for actual processing. FIG. 5 shows an effective exposure amount distribution, which is obtained by converting the intended processing configuration shown in FIG. 3 into the effective exposure amount.

In this embodiment, the conversion of the processing amount of the intended configuration into the effective exposure amount is performed in such a manner that a lookup table prepared by digitizing the relationship between the exposure amount and the processing amount shown in FIG. 4 is stored in advance in storage portion 7, and is referred to when the processing amount is to be converted into the effective exposure amount. In the case where the relationship between the exposure amount and the processing amount shown in FIG. 4 is approximately expressed by the function, the processing amount is converted into the effective exposure amount by obtaining a reverse function of the above function.

FIG. 5 shows, as the effective exposure amount, the exposure amounts required for exposure in the respective positions. The effective exposure amounts in various positions shown in FIG. 5 can be expressed as a function h(x) of position x.

The X-rays passed through the transparent opening of X-ray mask 32 have the intensity expressed as I·T, where I (W·m−2) represents the intensity of X-rays emitted from SR light source 1, and T represents the transmittance of the transparent opening of X-ray mask 32. In this embodiment, dose monitor 10 monitors the intensity I of the X-rays of SR light emitted by SR light source 1. Transmittance T of the transparent opening of X-ray mask 32 is constant throughout the transparent opening. Intensity I·T of the X-rays is determined by main controller 5 at appropriate times. The intensity of X-rays may be measured by dose monitor 10 before the processing, and the intensity of X-rays, which changes with time, may be predicted from the measured results and the attenuation characteristics of X-rays emitted from SR light source 1.

An exposure amount E on the irradiation region, where the resist of processing material 20 is irradiated with the X-rays passed through the transparent opening of X-ray mask 32, can be expressed by the following formula (1), where t represents the time:

$$E = \int ITdt \quad (1)$$

Since the transmittance T of the transparent opening is constant throughout the transparent opening, the exposure amount E of the irradiated region is determined by X-ray intensity I and the exposure time.

Figure 6:
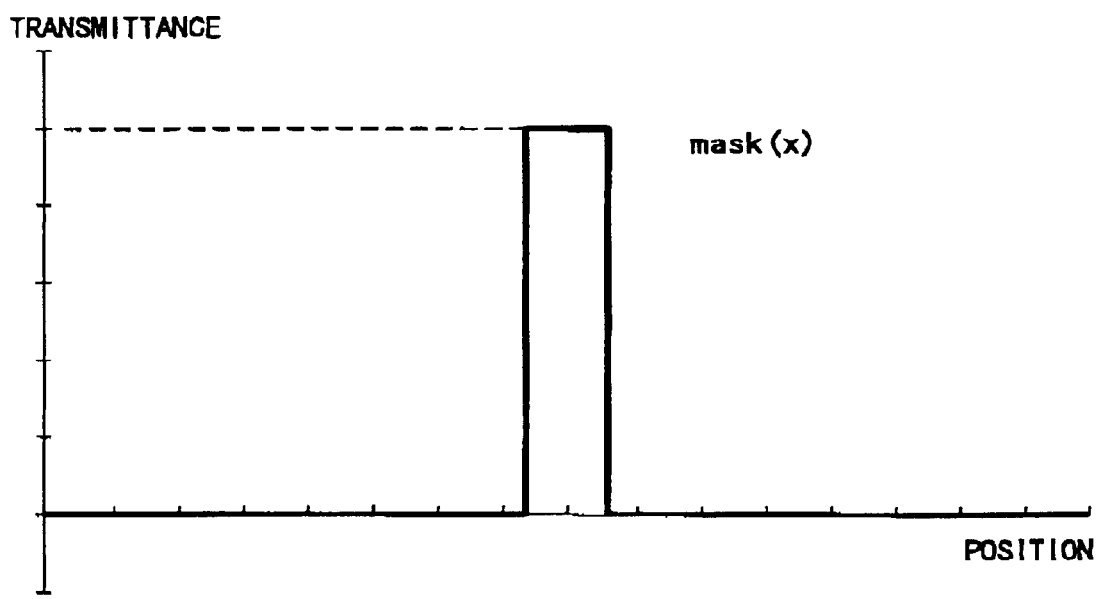
FIG. 6 shows an X-ray transmittance distribution of an X-ray mask.

FIG. 6 shows a X-ray transmittance distribution of X-ray mask 32. Referring to FIG. 6, the transmittance increases corresponding to the configuration of the transparent opening of X-ray mask 32, and the same transmittance is exhibited as the whole transparent opening. Accordingly, it can also be considered that the X-ray transmittance distribution of the X-ray mask represents the configuration of the transparent opening.

Since the X-rays have a high rectilinear property, the irradiation region, where processing material 20 is irradiated with the X-rays passed through the transparent opening, has the same configuration as the transparent opening of X-ray mask 32.

The X-ray transmittance distribution of X-ray mask 32 can be represented by a function mask(x) of position x. Function move(x) of position x is used to represent the movement of X-ray mask 32. Function move(x) represents the exposure amount, which occurs instantaneously in position x as a result of movement of X-ray mask 32. In other words, function move(x) represents the time, for which the center of transparent opening of X-ray mask 32 instantaneously exists in position x. Function h(x) of the effective exposure amount distribution shown in FIG. 5 is expressed as a convolution of function mask(x) and function move(x) by the following formula (2):

$$h(x) = \int \text{move}(a) \cdot \text{mask}(x-a) da \quad (2)$$

where x and a are variables representing the positions, respectively.

The intended processing configuration is determined as function h(x), as shown in FIG. 3. The X-ray transmittance distribution of X-ray mask 32 is determined as function mask(x) shown in FIG. 6. Accordingly, function move(x) representing the movement of X-ray mask 32 can be obtained from the formula (2).

However, the above manner can derive function move(x) provided that the relationship between the exposure amount and the processing amount is linear. This is a problem generally referred to as "deconvolution". Various manners for solution have been know, but the solutions cannot be obtained by simple arithmetic.

In the processing device of the embodiment, therefore, function move(x) is obtained by Fourier transformation of the formula (2). The result of the Fourier transformation of the formula (2) is expressed by the following formula (3).

$$H(u) = \text{MOVE}(u) \cdot \text{MASK}(u) \quad (3)$$

where functions obtained by Fourier transformation of the respective functions are represented in uppercase. The variable u is a frequency having a dimension of the reciprocal of the length, and is generally referred to as a spacial frequency.

Accordingly, function mask(x) representing movement of the mask can be obtained by Fourier inverse transformation of MOVE(u), which is obtained by transforming the formula (3) into the following formula (4).

$$\text{MOVE}(u) = H(u) / \text{MASK}(u) \quad (4)$$

Thus, function H(u) which is obtained by Fourier transformation of function h(x) representing the effective exposure amount distribution is divided by function MASK(u) which is obtained by Fourier transformation of function mask(u) representing the transmittance distribution of X-rays of X-ray mask 32. Fourier inversion is effected on the result of this division so that mask movement function move(x) achieving the effective exposure amount distribution.

Figure 7:
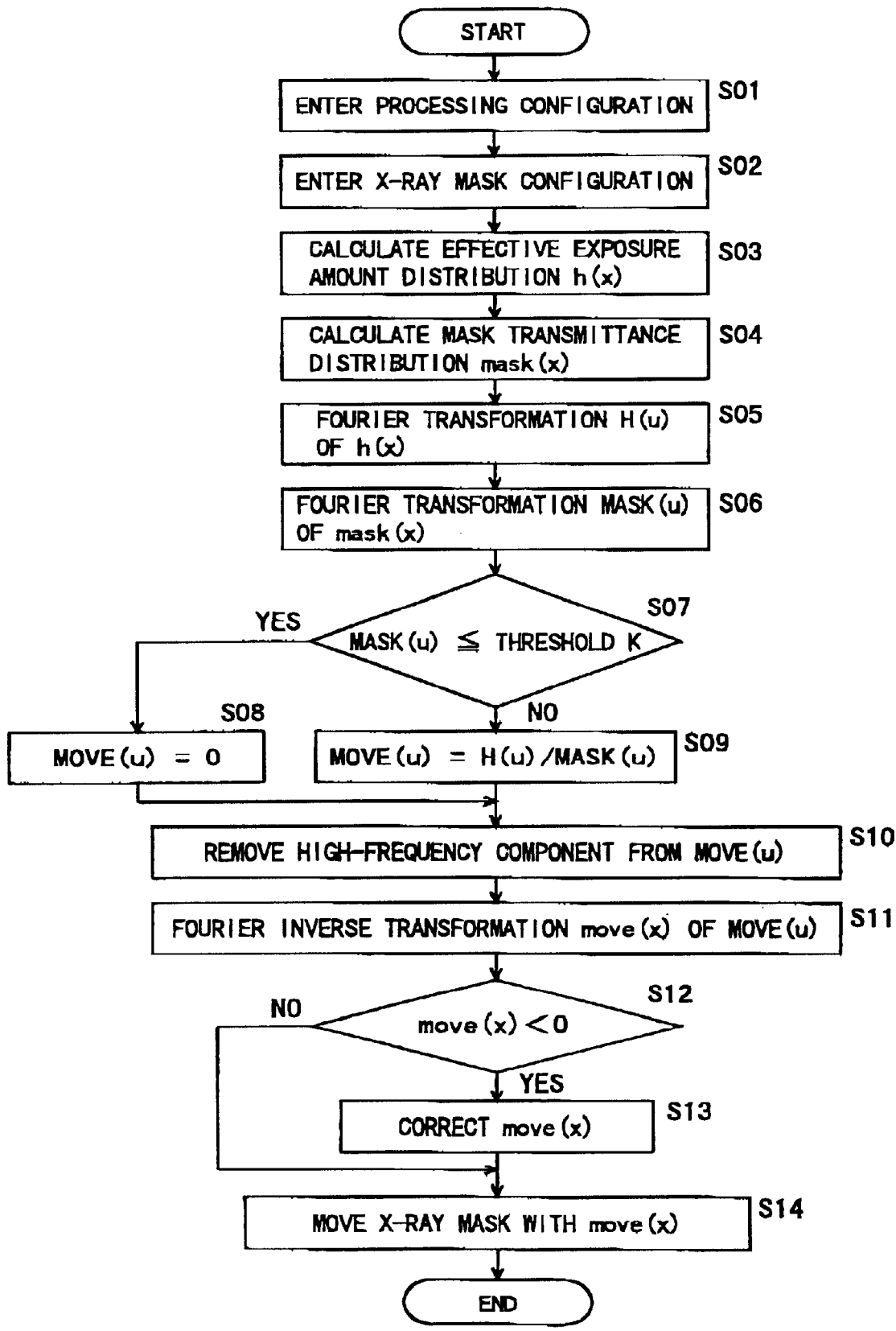
FIG. 7 is a flowchart showing a flow of exposure process performed by the processing device of the first embodiment.

Description will now be given on the processing process performed by the processing device of this embodiment. FIG. 7 is a flowchart showing a flow of exposure process performed by the processing device of the first embodiment. In the exposure process shown in FIG. 7, the processing configuration is first entered via input portion 6 (step S01). In this embodiment, the intended processing configuration shown in FIG. 3 is entered. The intended processing configuration is represented by the processing amounts in various positions x of the nozzle plate. As the input, digital data may be entered, or an approximated function may be entered.

Then, the configuration of X-ray mask 32 is entered (step S02). The foregoing configuration of X-ray mask 32 means the configuration of the transparent opening of X-ray mask 32. The configuration of X-ray mask 32 is the same as the values of X-ray transmittance in respective positions x. The input may be digital data or an approximated function.

Based on the relationship between the exposure amount and the processing amount shown in FIG. 4, the processing configuration entered in step S01 is converted into the effective exposure amount distribution in respective positions x. This provides function h(x) representing the effective exposure amount distribution, which represents the exposure amounts in respective positions x as shown in FIG. 5. By converting the processing amount into the exposure amount as described above, the system in which the linearity, i.e., precondition of the convolution is not established can be converted into the system in which the linearity is established. Therefore, the problem relating to the non-linearity is overcome, and correct results can be obtained.

In the actual arithmetic, the results of Fourier transformation are handled with complex numbers. For simplicity reason, however, the following description will be given in connection with only the results of real number portion. In simple functions, Fourier transformation may be analytically obtained.

Function mask(x) in FIG. 6, which represents the X-ray transmittance distribution of X-ray mask 32 is obtained from the configuration (transmittances in the respective positions x) of X-ray mask 32 entered in step S02.

Description will now be given on the transparent opening and the irradiation region. The irradiation region is a region, where resist (PMMA) on processing material 20 is irradiated with the X-rays passed through the transparent opening of X-ray mask 32. This irradiation region has the same configuration as the transparent opening of X-ray mask 32 owing to the rectilinear property of the X-rays. The exposure amount distribution in the irradiation region is obtained from transmittance T of the X-rays in the transparent opening and intensity I of the X-rays of SR light, which are emitted from SR light source 1 and are monitored by dose monitor 10.

Fourier transformation is effected on function h(x), which represents the effective exposure amount distribution and is obtained in step S03, to provide function H(u) (step S05). Fourier transformation is effected on function mask(x), which represents the X-ray transmittance distribution of X-ray mask 32 and is obtained in step S04, to provide function MASK(u) (step S06).

For the Fourier transformation, fast Fourier transformation (which will be referred to as "FFT" hereinafter) is used. FFT is performed by processing digital data, which is prepared by sampling and quantizing function h(x) representing the effective exposure amount distribution. For FFT, the number of data must be a power of 2. In this embodiment, digitizing is performed by sampling in 1024 points. The above FFT is used for every Fourier transformation.

FIG. 8 shows function H(u), which is obtained by Fourier transformation of function h(x) representing the effective exposure amount distribution shown in FIG. 5. The abscissa gives a frequency representing an inverse of the distance determined by position x, and the ordinate gives the exposure amount.

FIG. 9 shows function MASK(u) obtained by Fourier transformation of function mask(x), which represents the X-ray transmittance distribution of X-ray mask 32 shown in FIG. 6. The abscissa gives a frequency representing an inverse of the distance determined by position x, and the ordinate gives the transmittance.

Referring to FIG. 7 again, it is determined whether function MASK(u) contains a value equal to or smaller than a predetermined threshold K or not (step S07).

Frequency u, of which MASK(u) is equal to or smaller than threshold K, is processed in a step S08. Otherwise, Frequency u is processed in a step S09.

In step 508, function MOVE(u) is set to 0. In step S09, function MOVE(u) is obtained in accordance with the following formula (5):

$$MOVE(u)=H(u)MASK(u) \qquad (5)$$

Processes in steps S07–S09 are performed for the purpose of preventing diversion of function move(u), which would be caused if the arithmetic of formula (5) in step S09 were performed with the denominator MSK(u) taking the value of 0 or a minute value. For preventing the diversion of function MOVE(u), various techniques have been known in addition to the technique described herein, and such techniques may be employed.

High-frequency components are removed from function MOVE(u) obtained in step S08 or S09 (step S0). A known low-pass filter is used for this removal of the high-frequency components. The high-frequency components contained in function MOVE(u) are portions causing extremely rapid changes in the exposure amount included in mask movement function move(x), which is obtained as a result of Fourier inverse transformation to be described later. Even if the portions causing extremely rapid change in the exposure amount are substantially removed from the mask movement function move(x), this does not significantly affect the intended processing configuration.

The high-frequency components to be removed depend on the intended processing configuration. By filtering the high-frequency components which depend on the intended processing configuration, mask movement function move(x) can have a smooth form.

Then, Fourier inverse transformation is performed on function MOVE(u), from which the high-frequency components are removed, to obtain intended movement function move(x) (step S11).

It is determined whether movement function move(x) contains a negative value or not (step S12). If it contains a negative value, a step S13 is executed. If not, the process moves to a step S14.

In step S13, movement function move(x) is corrected. Depending on the processing configuration or the configuration of the transparent opening of X-ray mask 32, movement function move(x) to be obtained may contain a negative value. Movement function move(x) represents the exposure amounts in the respective positions, and the exposure amount cannot be negative in any position. An absolute value of the exposure amount taking the negative value is added to movement function move(x). This correction prevents such a disadvantage that the corrected movement function move(x) contains a negative value. A value which is already determined in advance may be added to movement function move(x).

Figure 10:
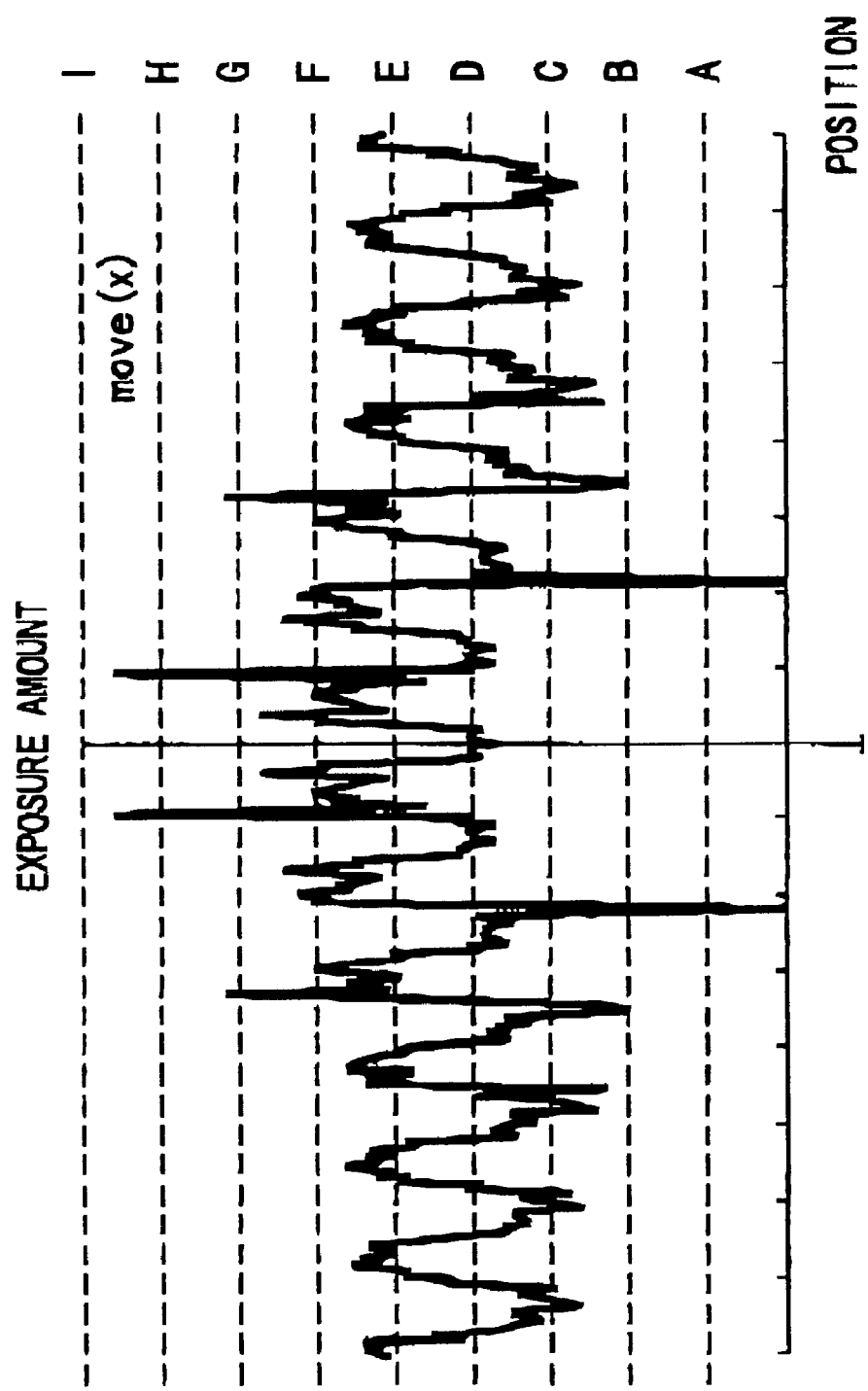
FIG. 10 shows a movement function move(x)

FIG. 10 shows movement function move(x). The abscissa gives the position, and the ordinate gives the exposure amount. Position x on the abscissa represents a position of a center of a portion exhibiting a high transmittance in the X-ray transmittance distribution of X-ray mask 32 shown in FIG. 6. In other words, position x represents the position defining the center of the transparent opening of X-ray mask 32. Accordingly, if the X-rays of SR light emitted from SR light source 1 has a constant intensity, movement function move(x) can be considered as a function showing the time, for which the center of the transparent opening of X-ray mask 32 stops in the position corresponding to position x on the resist (PMMA) of processing material 20. Even in the case where relatively long-term variations (attenuations or the like) are present in X-ray intensity, the X-ray intensity can be monitored by dose monitor 10 at appropriate times, and the time period for stopping X-ray mask 32 can be obtained in accordance with the monitored intensity, whereby the exposure can be performed on the irradiation region of processing material 20 by the amount equal to that in the case of the constant X-ray intensity.

Referring to FIG. 7, exposure stage 3 moves X-ray mask 32 in accordance with movement function move(x) thus obtained (step S14). Thereby, the resist of processing material 20 is exposed to achieve the effective exposure distribution, and is processed into the intended processing configuration.

Main controller 5 performs the foregoing exposure. Main controller 5 sends an instruction to stage controller 4 in accordance with movement function move(x) thus obtained. Stage controller 4 moves exposure stage 3 in accordance with the received instruction.

Figure 11:
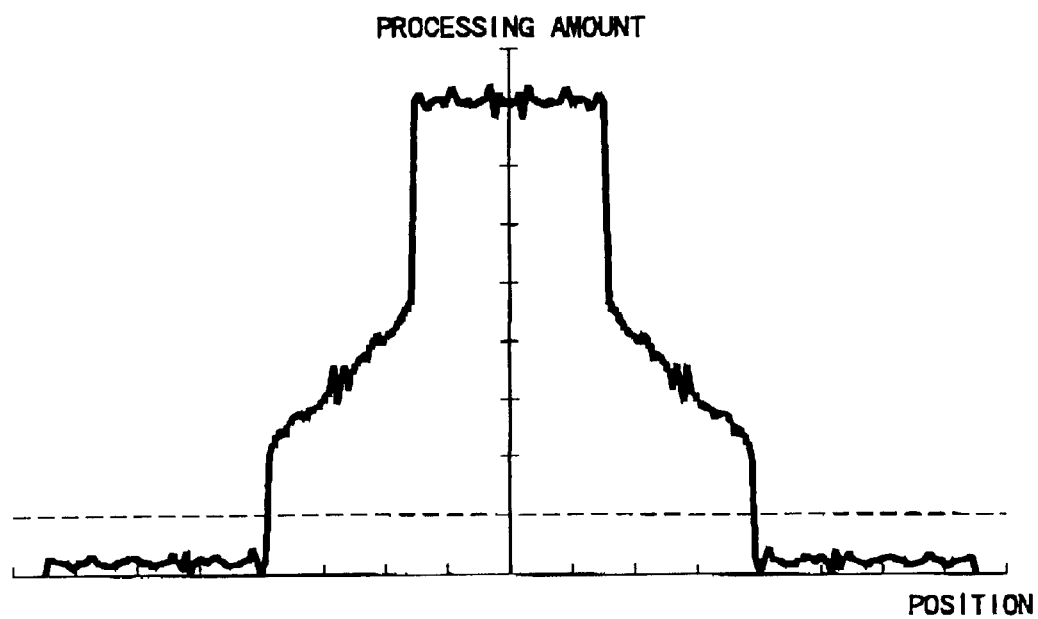
FIG. 11 shows a result of a simulation of exposure which is effected on resist (PMA) with an X-ray mask moved in accordance with the movement function (x) shown in FIG. 10.

FIG. 11 shows a result of simulation of exposure, which is effected on the resist (PMMA) of processing material 20 by moving X-ray mask 32 in accordance with movement function move(x) shown in FIG. 10. The configuration obtained by the processing is the substantially same as the intended processing configuration shown in FIG. 3. The configuration shown in FIG. 11 includes minute irregularities due to an error in arithmetic or the like. However, etching can be lightly effected on the whole resist of processing material 20 so that these irregularities can be removed to an extent not affecting ejection of ink.

Figure 12:
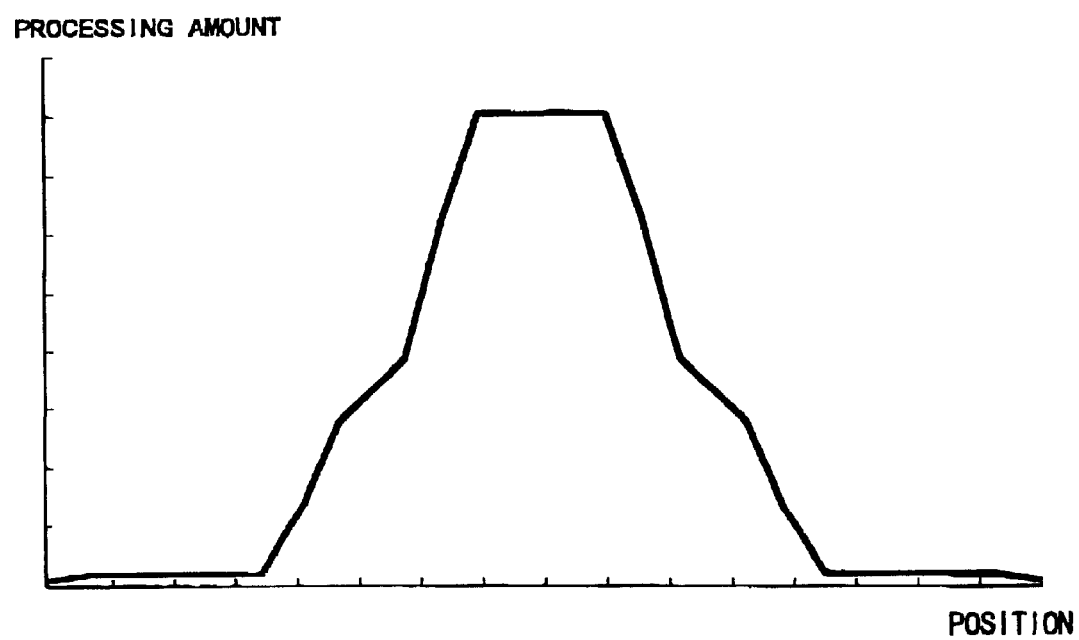
FIG. 12 shows a result of a simulation of exposure which is effected on resist (PMMA) with an X-ray mask moved in accordance with the intended configuration shown in FIG. 3.

If the transparent opening of X-ray mask 32 is smaller in size than the processing configuration only by an ignorable extent, the intended processing configuration can be produced by moving X-ray mask 32 in accordance with the intended processing configuration. However, the transparent portion of X-ray mask 32 differs in size from the intended processing configuration by an unignorable extent. Unless the correct movement pattern is obtained by the method according to the invention, a kind of blur occurs due to an influence exerted by the transparent opening of X-ray mask 32, and a distortion occurs in the produced configuration. FIG. 12 shows a result of a simulation of exposure, which is performed on the resist (PMMA) of processing material 20 while moving X-ray mask 32 in accordance with the intended processing configuration shown in FIG. 3. Blur occurs due to the fact that the transparent opening of X-ray mask 32 has a certain largeness. More specifically, the side wall of the nozzle, which is to be vertical, has a tapered form which is distorted with respect to the intended processing configuration.

The nozzle used in a head of an ink-jet printer is required to eject ink straight and to eject the ink in an accurate direction. At present, the head is provided with many nozzles for increasing the print speed. Therefore, it is extremely important that the many nozzles can eject the ink in the uniform direction. For ejecting the ink in the straight direction, it is effective that a straight portion is formed in the section of the nozzle. The processing configuration shown in FIG. 11 is provided with the above straight portion. However, the processed configuration shown in FIG. 12 has a tapered form formed in the portion to be straight, and the uniform ejection direction cannot be achieved.

In the processing configuration shown in FIGS. 12, the upper side corresponding to the opening of the nozzle is smaller in size than that of the intended processing configuration shown in FIG. 3. The size of the nozzle opening affects the discharge volume of the ink, and significantly and generally affects the density, quality and others of printed images. Accordingly, it is not preferable that the opening of the nozzle is smaller in size than the intended configuration.

Description will now be given on movement of X-ray mask 32 by mask moving mechanism 33. For simplicity reason, description has been given on the one-dimensional movement However, the two-dimensional movement is actually performed, and the two-dimensional scanning exposure is performed in accordance with a mask movement function move(x, y) expressed by the two-dimensional rectangular coordinates.

[Scanning Method Performed by Repeating Stop and Movement of X-Ray Mask 32]

Figure 13A:
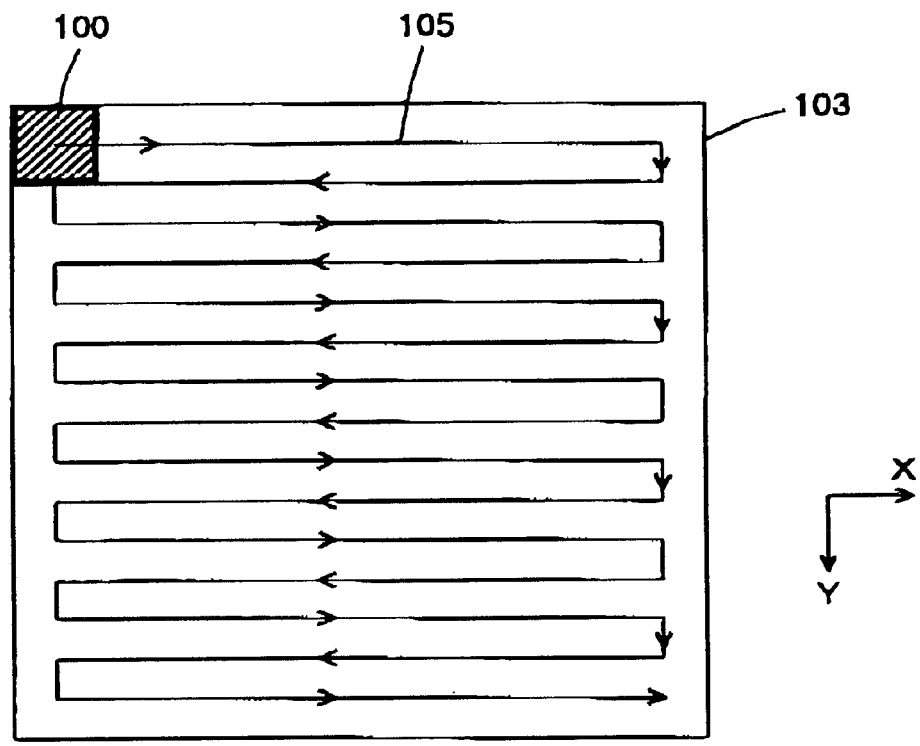
FIGS. 13A and 13B are first views for showing exposure with two-dimensional scanning.
Figure 13B:

FIGS. 13A and 13B are first views for showing the exposure by the two-dimensional scanning. FIG. 13A shows a path 105 through which an irradiation region 100 scans the resist (PMMA) of processing material 20. FIG. 13B shows a form of irradiation region 100. Referring to FIGS. 13A and 13B, a two-dimensional plane 103 of the processing configuration and irradiation region 100 are both rectangular. Scanning with irradiation region 100 is performed straight along scanning path 105.

Figure 14:
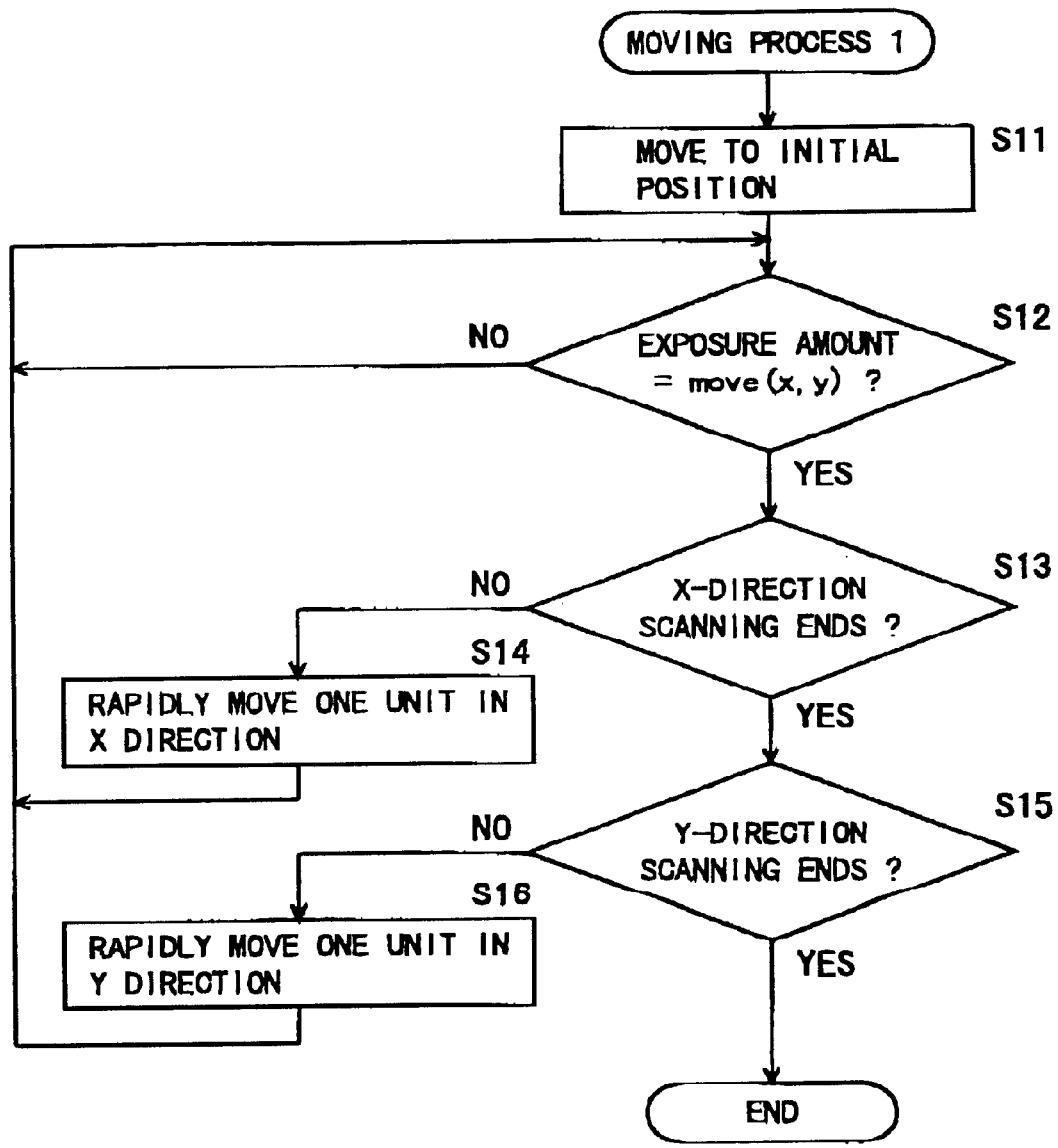
FIG. 14 is a first flowchart showing a flow of scanning process performed by the processing device of the first embodiment.

FIG. 14 is a first flowchart showing a flow of the scanning process performed by the processing device of the first embodiment. In the scanning process shown in FIG. 14, X-ray mask 32 is first moved to an initial position (step S11). Thereby, irradiation region 100 moves to the upper left position on two-dimensional plane 103 of the processing configuration in FIG. 13A.

It is determined whether the exposure amount in the position (x, y) on irradiation region 100 matches with movement function move(x, y) or not. The exposure in position (x, y) is performed until the exposure amount becomes equal to movement function move(x, y), and then the process moves to a step S13.

If SR light source 1 emits the X-rays at a constant intensity, the exposure amount can be obtained by measuring the exposure time. If relatively long-term variations (attenuations or the like) are present in the X-ray intensity, the exposure amount can be obtained by feed-back of the X-ray intensity monitored by dose monitor 10. More specifically, the exposure amount on irradiation region 100 is determined based on the X-ray intensity obtained from X-ray intensity I monitored by dose monitor 10 and transmittance T of the transparent opening of X-ray mask 32. Irradiation region 100 stops in position (x, y) until the value obtained by integrating the detected exposure amount becomes equal to movement function move(x, y).

Alternatively, the X-ray intensity may be measured by dose monitor 10 before the processing, and the intensity of X-ray varying with time may be estimated from the measured results and the attenuation characteristics of the X-rays emitted from SR light source 1. Thereby, the exposure amount on irradiation region 100 may be determined based on the estimated X-ray intensity.

In step S13, it is determined whether the scanning in the X direction is completed or not. When the scanning in the X direction is completed, the process moves to a step S15. Otherwise, the process moves to a step S14.

In step S14, X-ray mask 32 moves one unit distance at a high speed in the X direction. In the processing device of this embodiment, the unit distance in the X direction is equal to ½ of the length of irradiation region 100 in the X direction. The moving speed does not substantially affect the exposure of resist (PMMA) of processing material 20. This speed can be determined based on the relationship between the exposure amount and the processing amount shown in FIG. 3. For example, if the exposure amount is in a range from 0 to 0.05 (A·min), the processing amount is 0 µm, and the moving speed is determined corresponding to it so that the moving speed thus determined does not affect the exposure of the portion not to be exposed.

In a step S15, it is determined whether scanning in the Y direction is completed or not. When the scanning in the Y direction is completed, the exposure operation ends. Otherwise, the process moves to a step S16.

In step S16, X-ray mask 32 moves one unit distance in the Y direction at a high speed. In the processing device of this embodiment, the unit distance in the Y direction is equal to ½ of the length of irradiation region 100 in the Y direction. The moving speed does not substantially affect the exposure of the resist (PMMA) of processing material 20.

Figure 15A:
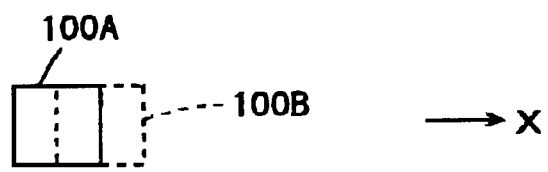
FIGS. 15A and 15B show movement of an irradiation region.
Figure 15B:
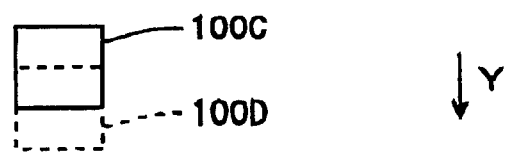

The movement of X-ray mask 32 performed in steps S14 and S16 will now be described in greater detail. The meaning of the movement of X-ray mask 32 is the same as that of the movement of the irradiation region. FIGS. 15A and 15B show the movement of the irradiation region. FIGS. 15A and 15B show the movement in the X direction, and FIG. 15B shows the movement in the Y direction. Referring to FIG. 15A, irradiation region 100A moves the one unit distance in the X direction, and thus moves half the length of irradiation region 100 in the X direction so that it reaches the position of irradiation region 100B. Thereby, halves of irradiation regions 100A and 100B overlap with each other.

The movement in the Y direction is performed similarly to the movement in the X direction, as shown in FIG. 15B. Thus, irradiation region 100C moves the one unit distance in the Y direction, and therefore moves half the length of irradiation region 100 in the Y direction so that it reaches the position of irradiation region 100D. Thereby, halves of irradiation regions 100C and 100D overlap with each other.

As described above, the two-dimensional plane of the processing configuration is divided such that the irradiation regions overlap with each other, and the exposure time of each of the divided irradiation regions is determined by movement function move(x). However, the exposure time of each irradiation region is corrected based on the distance by which the two-dimensional plane of the processing configuration is divided, and in other words, the distance of one unit of movement in each of the X and Y directions.

In the first embodiment, one unit distance of movement in each of the X and Y directions is half the length of the irradiation region in the X or Y direction. However, the unit distance is not restricted thereto, and may be either shorter or longer than the above. For example, the overlapped portions of the irradiation regions may be smaller than the above so that the unit distance can be increased such that the irradiation regions may be in contact with each other. Conversely, the unit distance may be reduced to a minimum value allowing movement of X-ray mask 32 in exposure stage 3.

By increasing the unit distance, the required number of movements of the irradiation region can be reduced, and therefore the processing time can be reduced. Meanwhile, by reducing the unit distance, the processing accuracy is improved. Since a trade-off is present between the processing time and the processing accuracy, it is desired to determine the unit distance in view of conditions, e.g., restricted by the processing configuration and the processing time. If prime importance is placed on the processing accuracy, it is desired to perform the scanning by continuously moving the irradiation region as described below, rather than repeating the movement and stop of the irradiation region.

Moving mechanism 34 reciprocates sample holder 31 in the X direction at a speed of 1 mm/second in accordance with an instruction sent from stage controller 4. Thereby, even if the X-rays of SR light emitted from SR light source 1 exhibit the intensity distribution which is not uniform, correction can be performed to provide the uniform intensity distribution in irradiation region 100 because the transparent opening of X-ray mask 32 moves throughout the range subjected to the X-rays of SR light emitted from SR light source 1.

As described above, X-ray mask 32 repeats the state for stopping its motion with respect to processing material 20 and the state for linearly moving so that X-ray mask 32 can move in accordance with movement function move(x, y).

[Scanning Method with X-Ray Mask 32 Moving at Speed Inversely Proportional to Exposure Time]

Figure 16A:
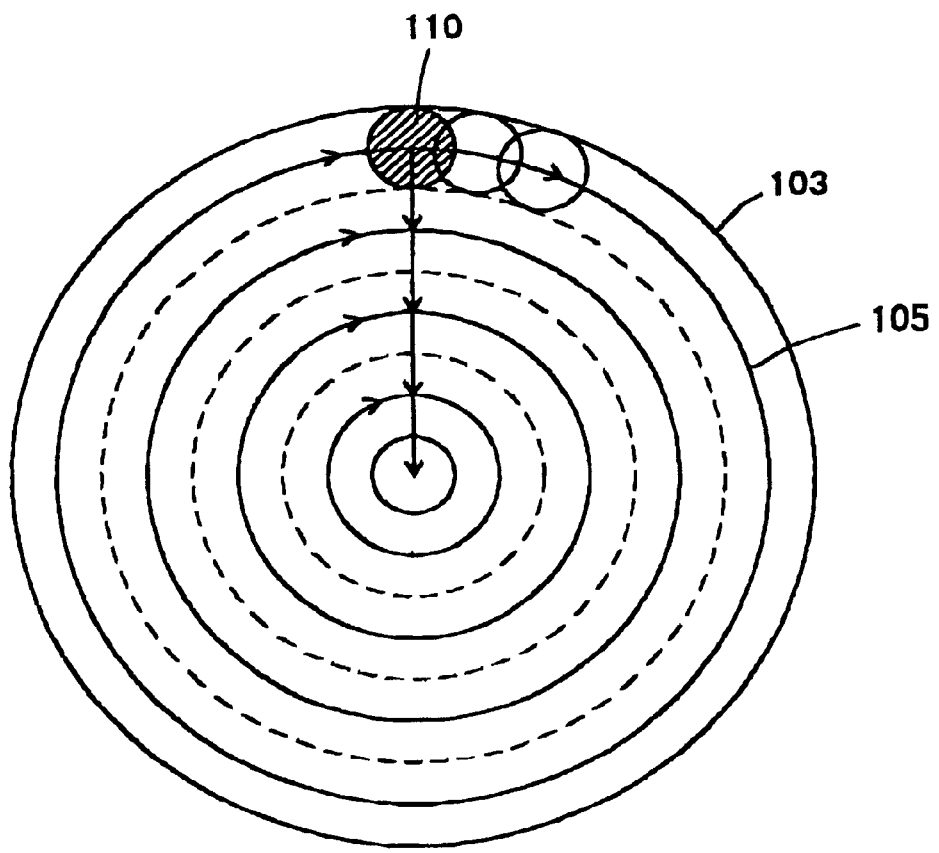
FIGS. 16A and 16B are second views for showing exposure with two-dimensional scanning.
Figure 16B:

FIGS. 16A and 16B are second views showing exposure performed by two-dimensional scanning. FIG. 16A shows a path 150 along which irradiation region 110 scans the resist (PMMA) of processing material 20. FIG. 16B shows the configuration of irradiation region 110. Referring to FIGS. 16A and 16B, the processing configuration has a circular two-dimensional plane 103, and irradiation region 110 is also circular.

If two-dimensional plane 103 of the processing configuration is symmetrical about a point, movement function move(x) may be expressed in the form of polar coordinates so that stage controller 4 can easily control moving mechanism 33. Mask moving mechanism 33 moves irradiation region 110 along a circular path 150 while controlling the moving speed in accordance with movement function move (x, y) obtained from the polar coordinates. The moving speed is determined such that the speed in the position (x, y) is inversely proportional to the exposure time, which is obtained by dividing movement function move(x, y) by the X-ray intensity measured by dose monitor 10. After the linear movement in the radial direction, the scanning is performed along the next path of a different turning radius.

For turning X-ray mask 32 by mask moving mechanism 33, sinusoidal waves of different phases in X and Y (i.e., two) directions are applied. Thereby, mask moving mechanism 33 can turn X-ray mask 32 relatively to the resist (PMA) of processing material 20.

Figure 17:
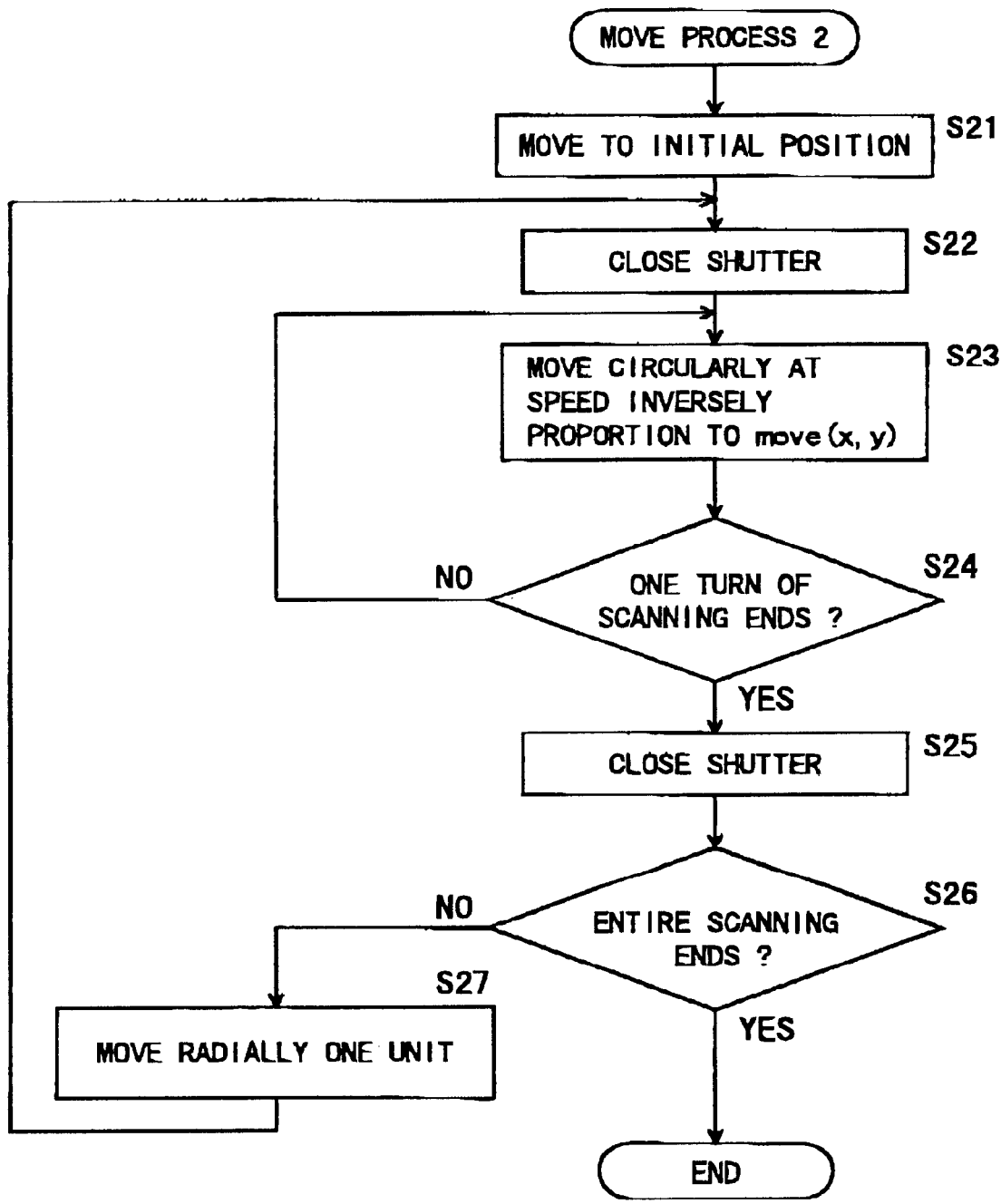
FIG. 17 is a second flowchart showing a flow of scanning process performed by the processing device of the first embodiment.

FIG. 17 is a second flowchart showing a flow of scanning process performed by the processing device of the embodiment. In the scanning process shown in FIG. 17, X-ray mask 32 is first moved to an initial position (step S21). Thereby, irradiation region 110 moves to the outermost position on two-dimensional plane 103 of the processing configuration, as shown in FIG. 16A.

Then, shutter 9 is opened to start the exposure (step S22). X-ray mask 32 moves at a speed determined by movement function move(x, y) (step S23). The moving speed is inversely proportional to the exposure time, which is obtained by dividing movement function move(x, y) by the X-ray intensity measured by does monitor 10. The moving speed is reduced if the exposure time is long. If the exposure time is short, the moving speed is increased. By controlling the moving speed in this manner, irradiation region 110 can move to expose the resist of processing material 20 with the exposure amount corresponding to the intended processing configuration.

It is determined whether the scanning by one circular turn is completed or not (step S24), and the operation in step S23 is performed until the completion is determined. When completed, shutter 9 is closed (step S25). This interrupts the exposure of the resist of processing material 20.

It is determined whether the required scanning is entirely completed or not (step S26). If completed, the process ends. If not, X-ray mask 32 moves one unit in the radial direction (step S27). The unit distance is equal to the diameter of irradiation region 110. Thereby, exposure can be performed without causing overlap of irradiation regions 110 aligned in the radial direction. In this case, the unit distance is shorter than the diameter of irradiation region 110, and the exposure time is corrected in accordance with the amount of overlap. This is the same as the operation in the foregoing case where the stop and movement are repeated.

For the next scanning, the process returns to step S22, and the foregoing operations are repeated.

As described above, X-ray mask 32 moves along a circle with respect to processing material 20 at a speed inversely proportional to the exposure amount expressed by movement function move(x, y), which is transformed into the polar coordinates, whereby X-ray mask 32 can move in accordance with movement function move(x, y).

[Scanning Method Executed by Performing Scanning Multiple Times with Divided Exposure Amounts]

Description will now be given on a scanning method, in which the scanning is performed multiple times with divided exposure amounts. In movement function move(x) shown in FIG. 10, the exposure amount is divided into nine levels 0–A, A–B, B–C, C–D, D–E, E–F, F–G, G–H and H–I. The scanning is performed with each of the divided exposure amount levels.

More specifically, exposure is performed for all the positions where the exposure amount takes the value equal to or larger than A, until the exposure amount takes the value of A. For the position where the exposure amount is smaller than A, the exposure is performed until the exposure amount corresponding to the position is achieved.

Then, exposure is performed for all the positions where the exposure amount takes the value larger than A, until the exposure amount takes the value of B. For the position where the exposure amount is smaller than B, the exposure is performed until the exposure amount corresponding to the position is achieved. The scanning in the above manner is performed for all the divided nine levels of exposure amount.

In this manner, the exposure is executed by performing the scanning multiple times. Thereby, the errors in position and exposure time are distributed in contrast to the case where the exposure is performed by one scanning operation. Accordingly, the errors are averaged, and the processing accuracy is improved.

The exposure amount for each position may be divided by a predetermined division number, whereby a similar effect can be achieved. The exposure for a predetermined time may be repeated. In this case, the exposure for each position is performed until the exposure amount, which is integrated for each position, becomes equal to movement function move (x). Further, similar scanning can be performed by dividing the exposure time instead of dividing the exposure amount.

The scanning method for performing the scanning multiple times with divided exposure amounts may be used for the two scanning methods, i.e., the method, in which the stop and movement of X-ray mask 32 are repeated as described above, as well as the method, in which X-ray mask 32 is moved at a speed inversely proportional to the exposure time.

The resist (PMMA) of processing material 20 described above is exposed, and is chemically processed to prepare the substrate. Electroplating is effected on the base formed of the substrate thus prepared, whereby a part made of metal can be obtained. Using the metal part thus prepared as a die, molding of resin is performed for producing parts of required configuration in large volume. These manufacturing processes are similar to those in the conventional LIGA method, and therefore description thereof is not repeated.

The processing device of the first embodiment performs the arithmetic on the spacial frequency plane prepared by the Fourier transformation. Instead of this, various manners, in which deconvolution can be performed on the spacial plane without the Fourier transformation, may be employed for obtaining the mask movement function.

The processing device of the first embodiment has been described in connection with the case where PMMA is used as the resist. However, PTFE (polytetrafluoroethylene) may be used instead of PMMA. If PTFE is used, direct processing (direct removal) with the X-rays of SR light can be performed. Accordingly, development is not necessary.

According to the processing device of the first embodiment, as described above, movement function move (x) for moving X-ray mask 32 can be obtained by simple arithmetic if the intended processing configuration and the configuration of the transparent opening of X-ray mask 32 are determined.

In the first embodiment, X-ray mask 32 is moved. Instead of this, X-ray mask 32 may be fixed, and processing material 20 may be moved. Both X-ray mask 82 and processing material 20 may be moved.

The first embodiment has been described in connection with the example of processing a single nozzle. For the ink-jet nozzle row formed of many nozzles, the foregoing processing can be performed by handling the functions of X-ray mask and the processing configuration as periodic functions of the nozzle pitch.

[Second Embodiment]

In the following description, a processing device of a second embodiment is applied to processing for forming nozzle bores in an ink-jet record head, through which ink is ejected.

Figure 18:
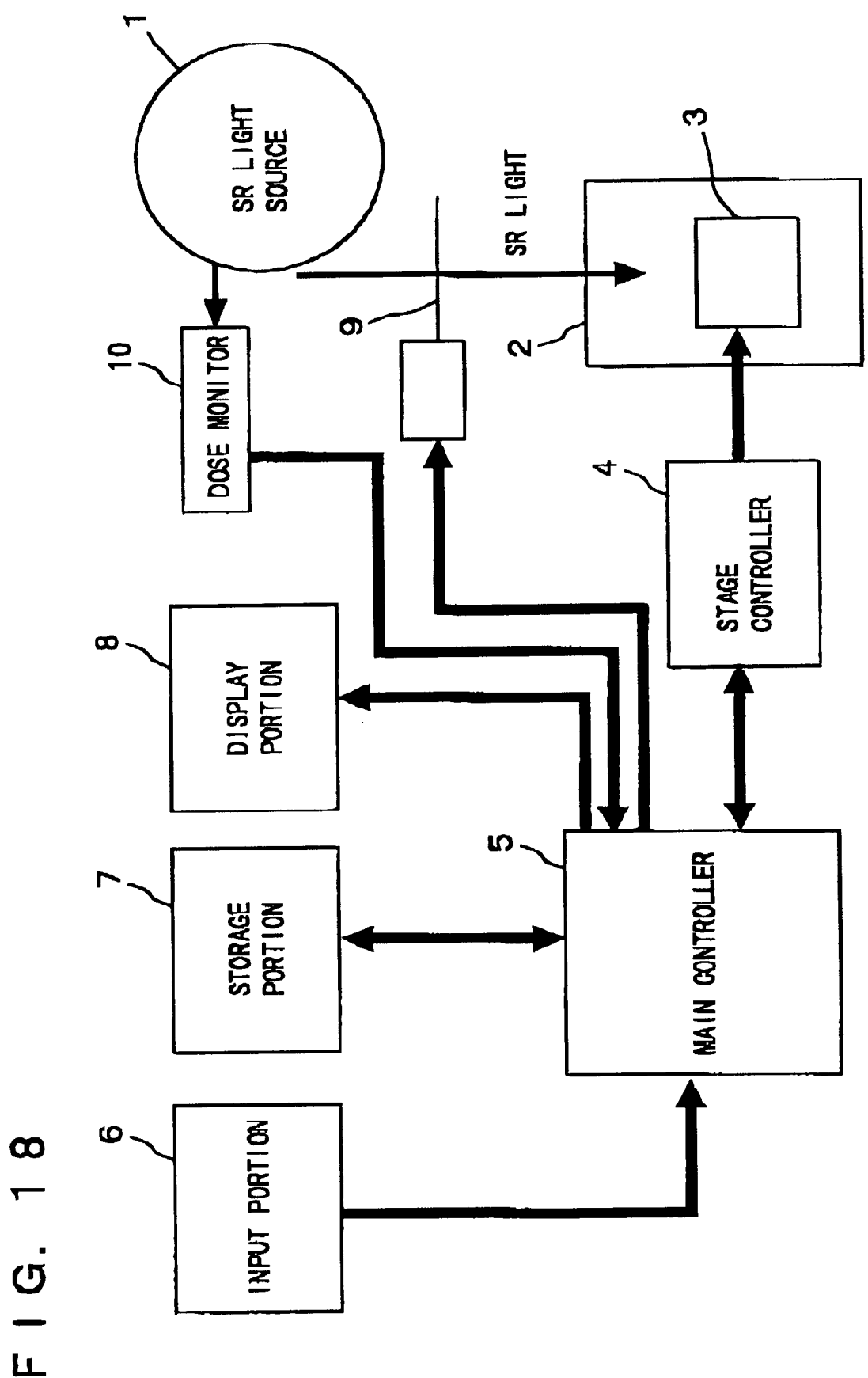
FIG. 18 shows a schematic structure of a processing device of a second embodiment.

FIG. 18 is a block diagram showing a schematic structure of the processing device of the second embodiment. Referring to FIG. 18, the schematic structure of the processing device is the same as that of the processing device of the first embodiment, and therefore description thereof is not repeated.

Figure 19:
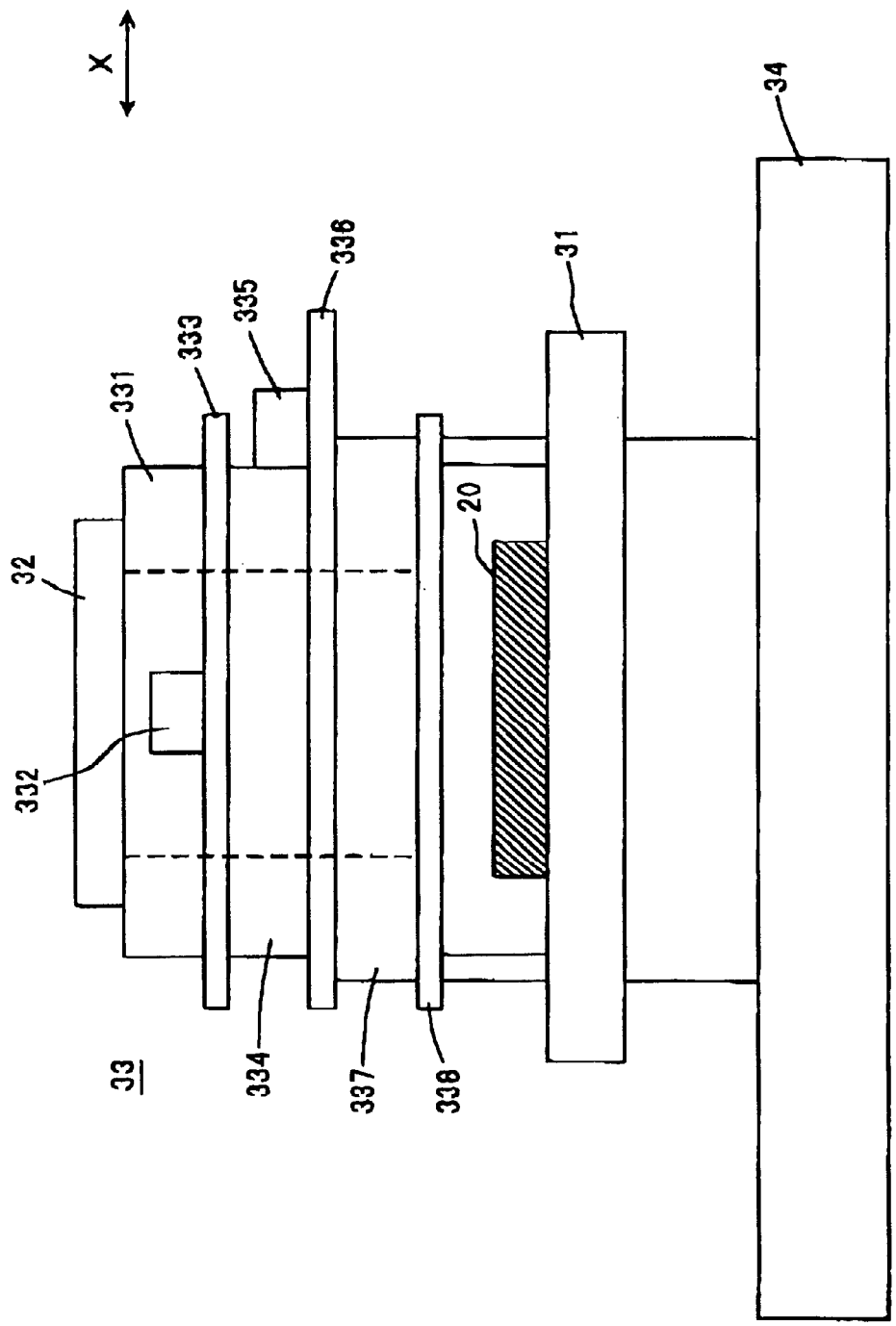
FIG. 19 is a side view of an exposure stage of the processing device of the second embodiment.

FIG. 19 is a side view of exposure stage 3. Referring to FIG. 19, exposure stage 3 includes sample holder 31 for holding processing material 20, X-ray mask 32 having the transparent opening of predetermined configuration for passing X-rays therethrough, mask moving mechanism 33 for moving X-ray mask 32 in two horizontal axis directions with respect to processing material 20, and reciprocating mechanism 34 for reciprocating sample holder 31, mask moving mechanism 33 and X-ray mask 32 in a horizontal direction.

X-ray mask 32 has the circular transparent opening, through which the X-rays of SR light emitted from SR light source 1 pass. The transparent opening has an area smaller than that of a section of the processing configuration perpendicular to the incident direction of the X-rays. Processing material 20 is formed by applying PMMA onto the substrate, and has a thickness of hundreds of millimeters.

Mask moving mechanism 33 is primarily formed of three layers. The first layer on the side subjected to the X-rays includes a Y-axis stage 331 for holding X-ray mask 32 while allowing movement in a direction (which will be referred to as a "direction Y" hereinafter) perpendicular to the sheet of FIG. 19, a first Y-axis actuator 332 for oscillating Y-axis stage 331 in direction Y, and a Y-axis base plate 333. Y-axis base plate 333 holds Y-axis stage 331 and first Y-axis actuator 332. Y-axis stage 331 is movable on Y-axis base plate 333 in direction Y.

The second layer under the first layer includes an X-axis stage 334 for holding Y-axis base plate 333 while allowing movement in a direction, which is indicated by an arrow X in FIG. 19, and will be referred to as a "direction X" hereinafter, a first X-axis actuator 335 for oscillating X-axis stage 334 in direction X, and an X-axis base plate 336. X-axis base plate 336 holds X-axis stage 334 and first X-axis actuator 335. X-axis stage 334 is movable on X-axis base plate 336 in direction X.

The third layer under the second layer includes an XY stage 337 for holding X-axis base plate 336, a second X-axis actuator for moving XY stage 337 in direction X, a second Y-axis actuator for moving XY stage 337 in direction Y, and an XY-axis base plate 338. XY-axis base plate 338 holds XY stage 337, the second X-axis actuator and second Y-axis actuator. XY stage 337 is movable on XY-axis base plate 3386 in direction X and direction Y.

First Y-axis actuator 332 in the first layer and first X-aus actuator 335 in the second layer are formed of piezoelectric elements, which will be referred to as "PZTs" hereinafter, and can move Y-axis stage 331 and X-axis stage 334 by distances on the order of nanometers, respectively. The maximum displacement thereof may nearly 10 μm. The foregoing actuators may be commercially available products such as Model P-804.10 manufactured by Physick Instrumente Co., Ltd.

The second X-axis actuator and the second Y-axis actuator in the third layer move XY stage 337 by distances on the order of nanometers. The third layer is also provided with sensors for detecting the position of XY stage 337. The outputs of these sensors are fed back to the signals for driving the second X-axis and Y-axis actuators by distances on the order of nanometers. Stage controller 4 performs this positioning control. This embodiment employs Model P-731.10 manufactured by Physick Instrumente Co., Ltd. as a device which can position XY stage 337 with a high accuracy on the order of nanometers.

Y-axis stage 331, Y-axis base plate 333, X-axis stage 334, X-axis base plate 336, XY stage 387 and XY-axis base plate 338 have hollow structures, respectively, so that the X-rays passed through X-ray mask 32 may be applied to processing material 20.

Sample holder 31 holds XY-axis base plate 338 and processing material 20. Reciprocating mechanism 34 is a stage including a combination of a stepping motor and a ball screw, and can reciprocate sample holder 31 at a speed of 1 mm/second in direction X.

Exposure stage 3 thus constructed can move X-ray mask 32 relatively to processing material 20 in the following manner.

(1) Oscillation (which will also be referred to as "oscillation Y" hereinafter) in direction Y by first Y-axis actuator 332 in the first layer of mask moving mechanism 33.

(2) Oscillation (which will be referred to as "oscillation X" hereinafter) in direction X by first X-axis actuator 335 in the second layer of mask moving mechanism 33.

(3) Movement (which will be referred to as "movement XY" hereinafter) in the directions X and Y by the second X-axis actuator and the second Y-axis actuator in mask moving mechanism 33.

By the "oscillation X" and "oscillation Y", X-ray mask 32 is oscillated in direction X and direction Y with respect to processing material 20, respectively. By the "movement XY", X-ray mask 32 is moved in directions X and Y with respect to processing material 20. The "movement XY" will be described later in greater detail.

The reciprocation (which will be referred to as "mask reciprocation" hereinafter) in direction X by reciprocating mechanism 34 is performed for the purpose of scanning by X-ray mask 32 the whole range subjected to the X-rays of SR light, which is emitted from SR light source 1. The X-rays of SR light emitted from SR light source 1 may have a smooth intensity distribution. In view of this, X-ray mask 32 is configured to scan the whole area subjected to the X-rays. Thereby, the X-rays passed through the transparent opening of X-ray mask 32 have the intensity distribution in the averaged form, and the correction is performed to uniformize the intensity of X-rays emitted to processing material 20. For more reliably correction, reciprocating mechanism 34 may reciprocate sample holder 31 in direction Y in addition to direction X.

Control of mask moving mechanism 33 will now be described. Stage controller 4 applies drive voltages for driving the piezoelectric elements of mask moving mechanism 33.

First, description will be given on the driving of the second X-axis actuator and second Y-axis actuator in the third layer of mask moving mechanism 33. The processing device of the second embodiment moves X-ray mask 32 relatively to the resist of processing material 20 so that the exposure amount of resist of processing material 20 may change depending on the portion or position. Thereby, the resist of processing material 20 may be processed into three-dimensional configuration, which has different sections in the direction perpendicular to the incident direction of X-rays, and has a thickness of hundreds of micrometers.

Figure 20:
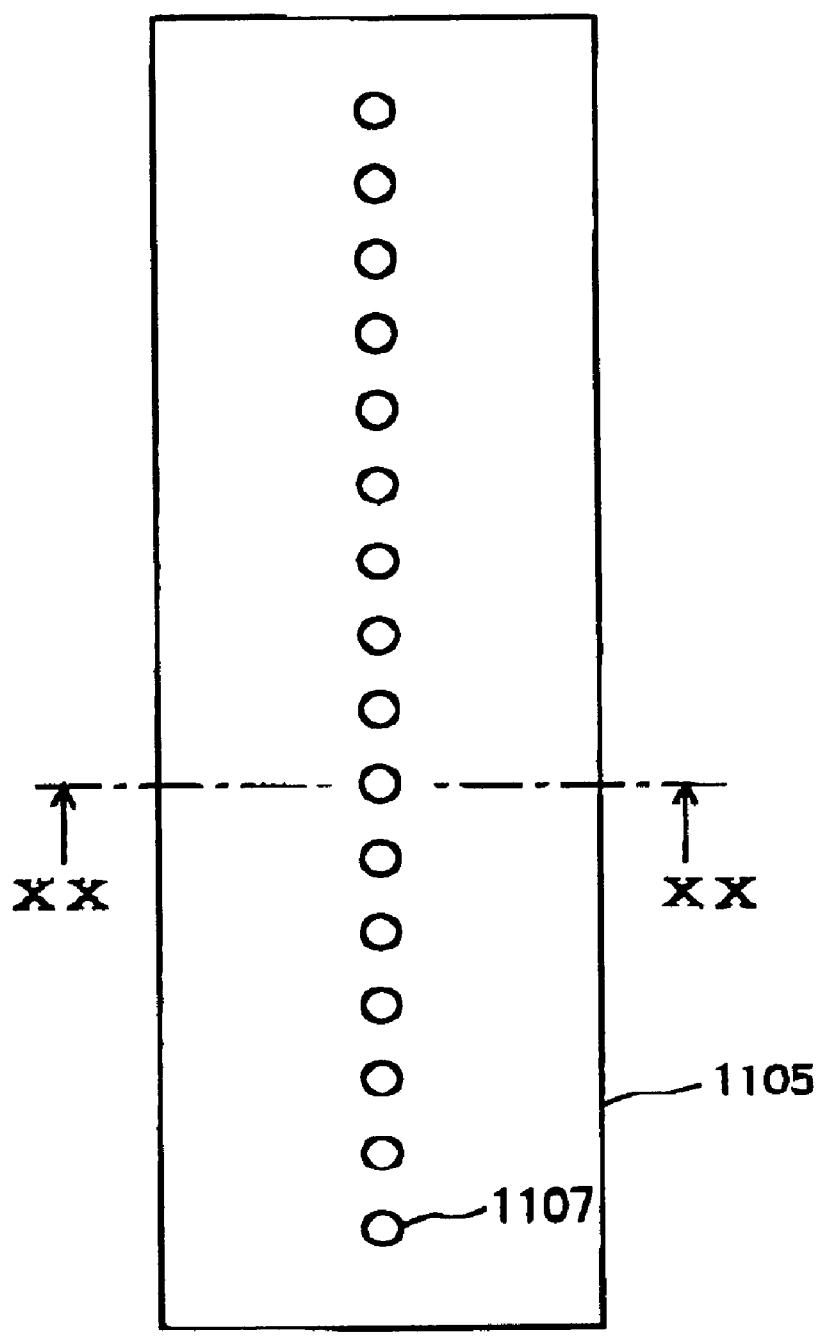
FIG. 20 is a plan showing a nozzle plate of an ink-jet record head in the second embodiment.
Figure 21:
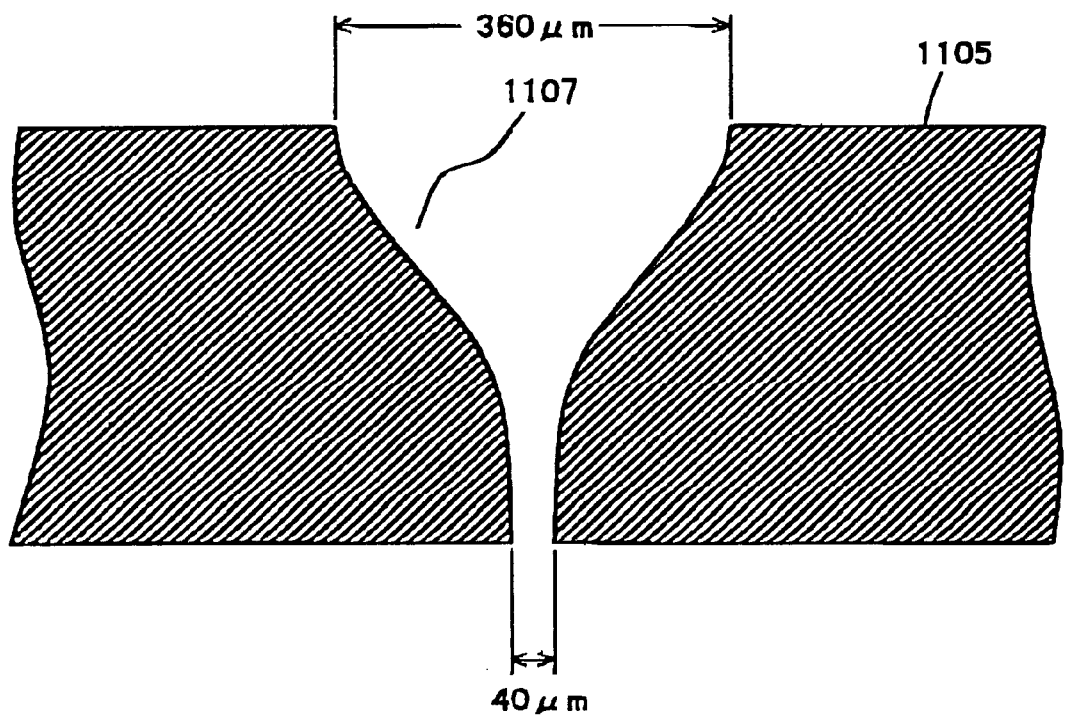
FIG. 21 is a cross section taken along line XX—XX in FIG. 20.

In connection with the this, description will be given by way of example on the processing for producing a nozzle plate of an ink-jet record head. FIG. 20 is a plan of a nozzle plate of the ink-jet record head in the second embodiment. FIG. 21 is a cross section taken along line XX—XX in FIG. 20. Referring to FIGS. 20 and 21, a nozzle plate 1105 is provided with a plurality of nozzle bores 1107. Nozzle bore 1107 has a diameter of 360 μm on one of the surfaces of nozzle plate 1105, and has a diameter of 40 μm on the other surface.

Figure 22:
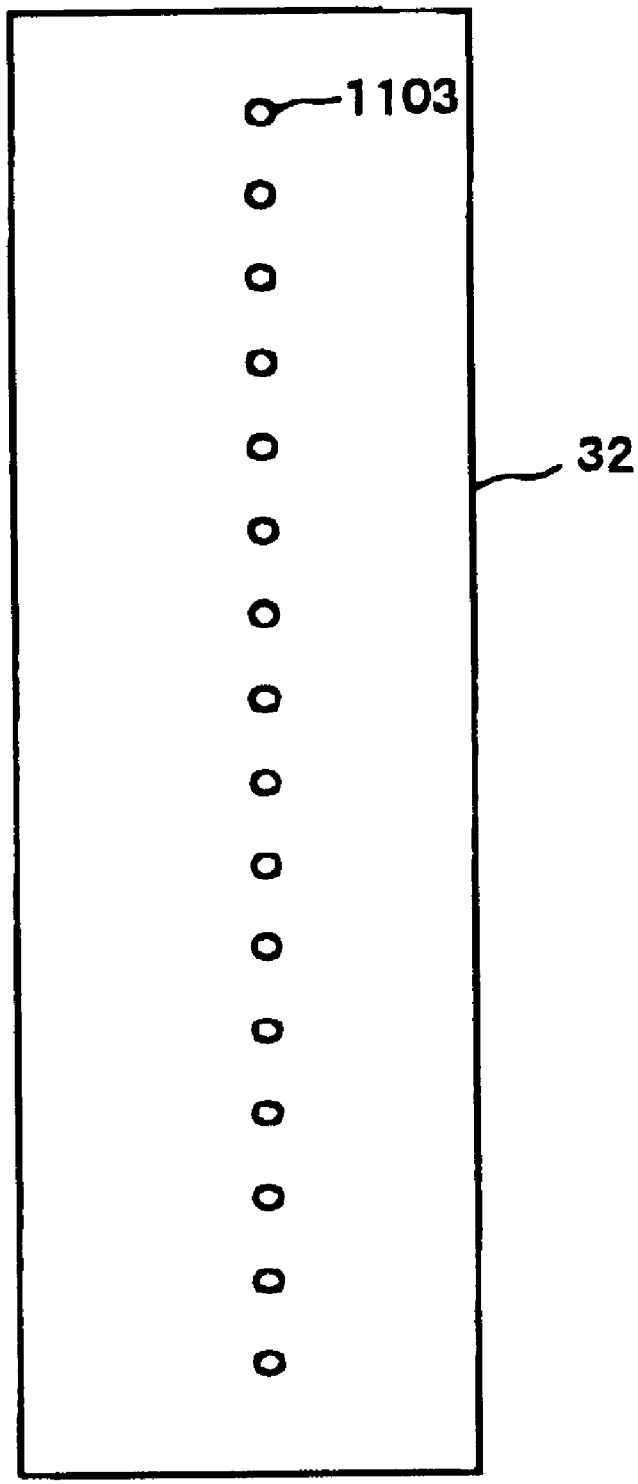
FIG. 22 is a plan of an X-ray mask used in the processing device of the second embodiment.

FIG. 22 is a plan of X-ray mask 32 used in the processing device of the second embodiment. Referring to FIG. 22, X-ray mask 32 has transparent openings 1103 corresponding in number to the nozzle bores to be formed in the nozzle plate. Transparent opening 1103 has a diameter of 200 μm. Transparent opening 1103 passes the X-rays of SR light emitted from SR light source 1. X-ray mask 32 and nozzle plate 1105 which is not yet processed are arranged on the processing device, and are moved by the second X- and Y-axis actuators in the third layer of mask moving mechanism 33.

This movement is performed by applying the drive voltages to the second X- and Y-axis actuators from stage controller 4. Stage controller 4 is provided with a memory for storing drive waveforms of the voltages to be applied to the second X- and Y-axis actuators. This memory stores the drive waveforms sent from main controller 5. Stage controller 4 reads out the drive waveforms stored in the memory, and applies the drive voltages subjected to digital-to-analog conversion to the second X- and Y-axis actuators.

In the second embodiment, nozzle plate 1105 is processed to form nozzle bores 1107 of the configuration shown in FIGS. 20 and 21. For this, X-ray mask 32 is moved such that the center thereof may move along a circle of 80 μm in radius. For moving X-ray mask 32 in this manner, the drive voltages applied to the second X- and Y-axis actuators have sinusoidal waveforms, which have the same amplitude and the same period, but have phases shifted by 90 degrees from each other.

The period of the sinusoidal wave may be determined such that the exposure is entirely completed while X-ray mask 32 is moving along one circle of 80 μm in radius. However, the period of the sinusoidal waveform may be determined such that the exposure is completed while X-ray mask 32 is turning N times along the circle. By setting the period of the sinusoidal wave as described above, the positioning error of XY stage 337 appears in every turn so that the positioning error can be averaged. Thereby, such a situation can be prevented that the errors in positioning of XY stage 337 are concentrated on a specific portion of the processed configuration.

Figure 23:
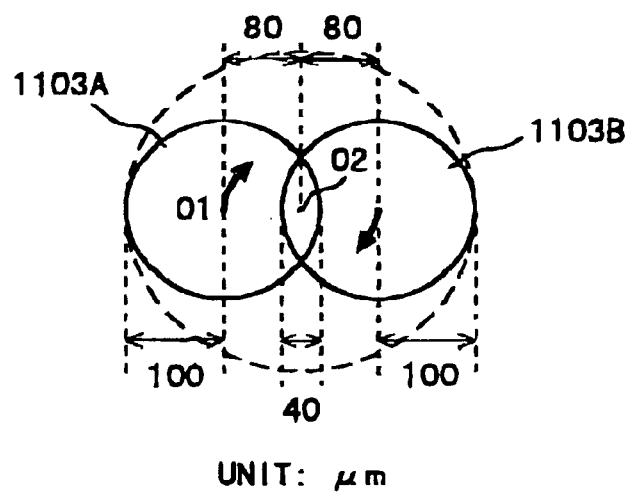
FIG. 23 is a view showing movement of a transparent opening in the X-ray mask.

FIG. 23 shows movement of transparent opening 1103 of X-ray mask 32. Referring to FIG. 23, X-ray mask 32 moves along a circle having a center O2, which is spaced by 80 μm from a center O1 of transparent opening 1103A. In a range spaced by 20 μm or less from point O2, the resist of processing material 20 is always exposed to the X-rays. In a range other than the above, the exposure is effected only temporarily depending on the position of transparent opening 1103A, and the exposure amount is smaller than that in the range spaced by 20 μm or less from point O2. By moving X-ray mask 32 in the above manner, nozzle bores 1107 shown in FIGS. 20 and 21 can be formed in nozzle plate 1105.

Figure 24:
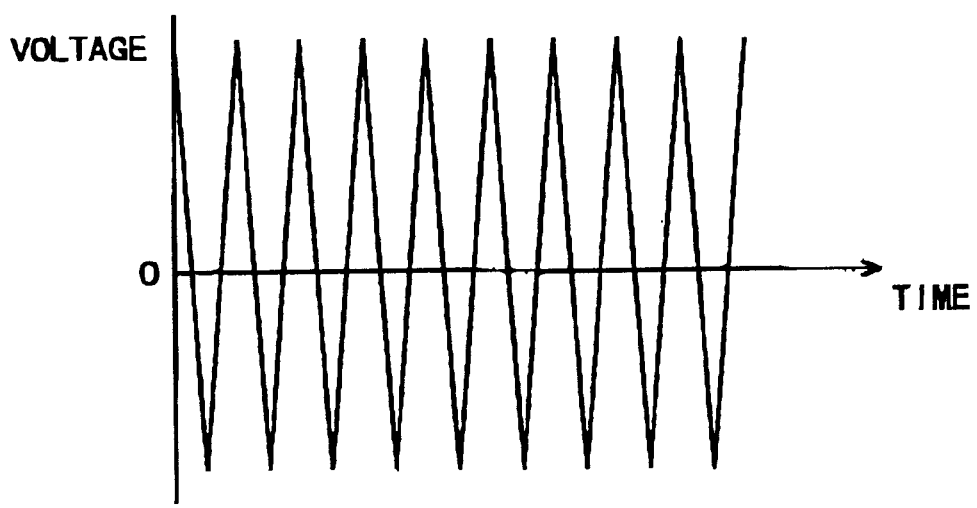
FIG. 24 shows a drive voltage applied to a first Y-axis actuator or a first X-axis actuator.
Figure 25:
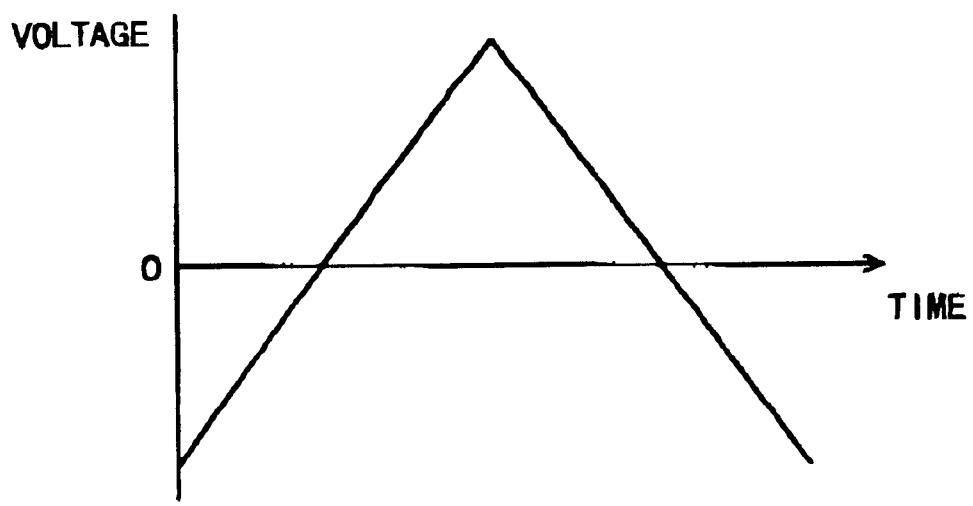
FIG. 25 shows the drive voltage applied to the first Y-axis actuator or the first X-axis actuator.

Description will now be given on the driving by first Y-axis actuator 332 in the first layer of mask moving mechanism 33 and first X-axis actuator 335 in the second layer. First Y-axis actuator 332 and first X-axis actuator 335 are driven by stage controller 4. FIGS. 24 and 25 show the drive voltage applied to first Y axis actuator 332 or first X-axis actuator 335. In both the FIGS. 24 and 25, the abscissa gives the time, and the ordinate gives the voltage. The signals shown in FIGS. 24 and 25 are formed of triangular waveforms of the same amplitude, respectively. The triangular wave shown in FIG. 24 has a period equal to ⅑ of the period of the triangular wave shown in FIG. 25.

The amplitudes of the waves of the drive voltages shown in FIGS. 24 and 25 are determined based on an error in manufacturing of transparent opening 1103 of X-ray mask 32. Assuming that the configuration of transparent opening 1103 has an error of 1 μm at the maximum, the amplitude of oscillation of X-ray mask 32 is set to 2 μm. Therefore, the amplitudes of the voltages applied to first Y-axis actuator 332 and first X-axis actuator 335 are determined such that X-ray mask 32 oscillates with amplitudes of 2 μm in the directions X and Y, respectively. In the second embodiment, the amplitude of X-ray mask in direction X or Y is double the maximum value of the error in configuration of transparent opening 1103. However, the amplitude may be larger by several times, and preferably by 1.5 to 4 times larger than the error in transparent opening 1103 of X-ray mask 32.

The signal shown in FIG. 24 is applied to first Y-axis actuator 332, and the signal in FIG. 25 is applied to first X-axis actuator 335, whereby X-ray mask 32 makes nine reciprocations in direction Y while it make one reciprocation in direction X. By applying the triangular waves of different periods to first Y-axis actuator 332 and first X-axis actuator 335, X-ray mask 32 moves throughout the predetermined two-dimensional range. If these periods are prime to each other, X-ray mask 32 can be moved uniformly throughout the predetermined two-dimensional range.

The waveforms of drive voltages shown in FIGS. 24 and 25 have periods determined such that X-ray mask 32 may move at a higher speed than that of X-ray mask 32 moved by the second Y-axis actuator and the second X-axis actuator. Thereby, transparent opening 1103 of X-ray mask 32 oscillates in the respective positions to which it moves, and thereby moves through the predetermined two-dimensional range. Accordingly, processing can be performed to form the nozzle bore of the three-dimensional configuration having different processing depths. Also, the error in configuration of transparent opening 1103 can be averaged over the region subjected to the exposure. In the case where the plurality of nozzle bores are simultaneously formed by the processing with X-ray mask 32 having the plurality of transparent openings 1103, the error in configuration of the plurality of transparent openings 1103 is averaged over the region subjected to the exposure so that the plurality of nozzle bores can have averaged configurations.

During the exposure, the voltages applied to the first Y- and X-axis actuators 332 and 335 may be changed to each other, whereby X-ray mask 32 can move uniformly through the predetermined two-dimensional range.

Although the foregoing voltages applied to first Y- and X-axis actuators 332 and 335 may have the same amplitude, these voltages may have different amplitudes, respectively. In this case, transparent opening 1103 of X-ray mask 32 oscillates within a predetermined rectangular range.

Owing to oscillating X-ray mask 32 in the above manner, the configuration of the exposed region differs from that of transparent opening 1103. Therefore, even if a difference is present in configuration among the plurality of transparent openings 1103 of X-ray mask 32, the exposure distribution of the X-rays passed through respective transparent openings 1103 is averaged among the plurality of transparent openings 1103. Thereby, it is possible to suppress variations in configuration of the plurality of nozzle bores 1107 formed in nozzle plate 1105.

Figure 26:
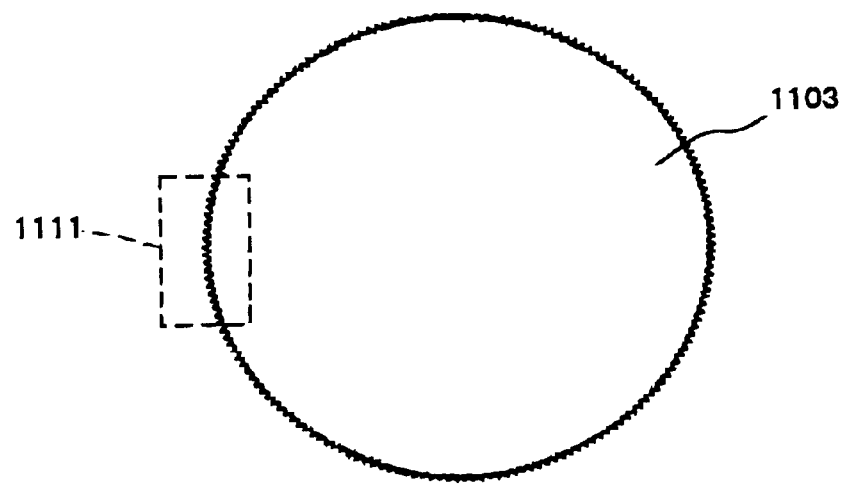
FIG. 26 shows, on an enlarged scale, one of the transparent portions of the X-ray mask.
Figure 27:
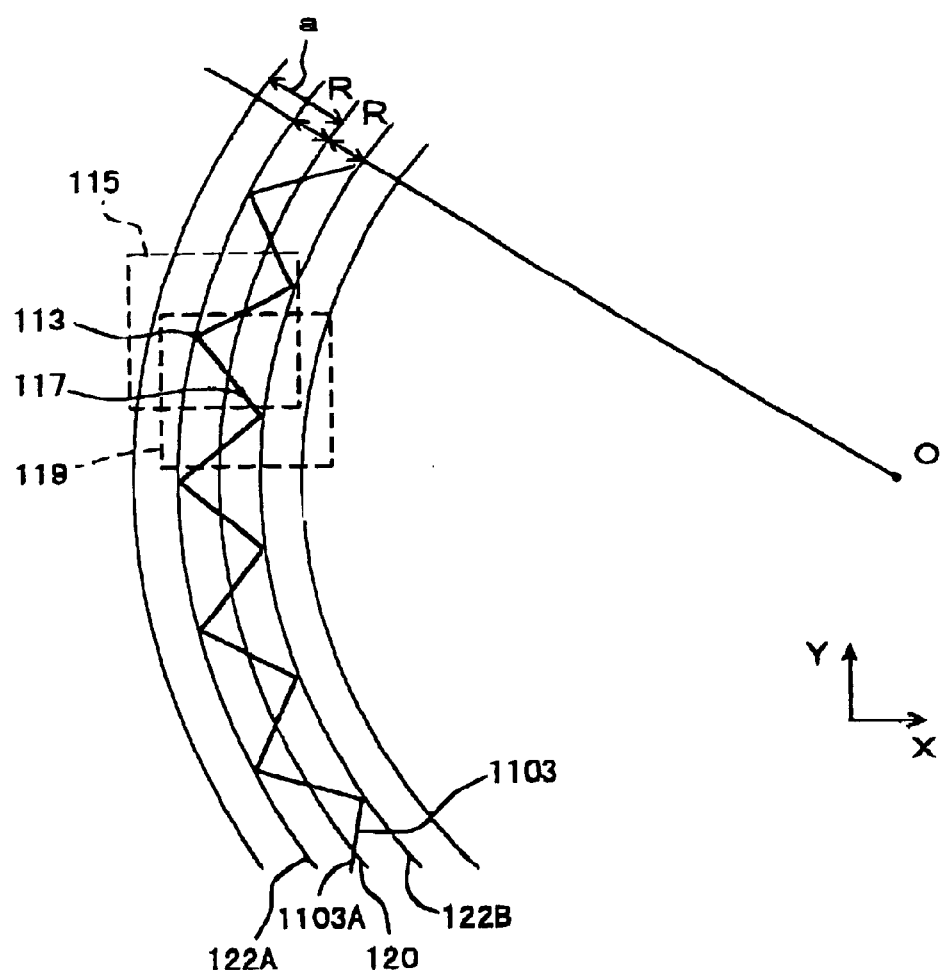
FIG. 27 shows, on an enlarged scale, a portion in FIG. 26.

FIG. 26 shows, on an enlarged scale, one of transparent openings 1103 of X-ray mask 32. X-ray mask 32 has transparent opening 1103, which is designed to be completely circular. Due to the manufacturing error however, slight irregularities appear as an error in configuration of transparent opening 1103 to be completely circular. FIG. 27 shows on an enlarged scale a portion 1111 in FIG. 26. Referring to FIG. 27, a peripheral portion 1103A of transparent portion 1103 is shifted from an intended configuration 120 of transparent portion 1103. This error is represented as a distance of outward or inward shift from intended configuration 120 of transparent portion 1103. In FIG. 27, the maximum value of this error is indicated by "R".

By oscillating X-ray mask 32 in directions X and Y in accordance with triangular waves of an amplitude a (a=2R), a point 113 on periphery or configuration 1103A of transparent portion 1103 moves within a range 115. Likewise, a point 117 on configuration 1103A of transparent portion 1103 moves within a range 119. Each of ranges 115 and 119 is a square having a side length of 4R. Range 115 is uniformly exposed by the X-rays passed through point 113. Range 119 is uniformly exposed by X-rays passed through point 117.

By oscillating X-ray mask 32 in directions X and Y as described above, the X-rays passed through transparent portion 1103 can be emitted to a region on the resist of processing material 20, which does not match with the configuration of transparent portion 1103, and has an outer periphery blurred correspondingly to the amplitude of oscillation of X-ray mask 32. Therefore, such a situation is prevented that the error in configuration of transparent portion 1103 directly appears in the processed configuration of the resist of processing material 20. This is owing to the fact that the error in configuration of transparent portion 1103 is averaged in the region subjected to the X-ray as a result of oscillation of X-ray mask 32.

Accordingly, even if the plurality of transparent portions 1103 have different configurations due to an error, the exposure amount of the resist of processing material 20 can be substantially uniform between transparent portions 1103. As a result, variations in processed configuration can be suppressed.

Figure 28:
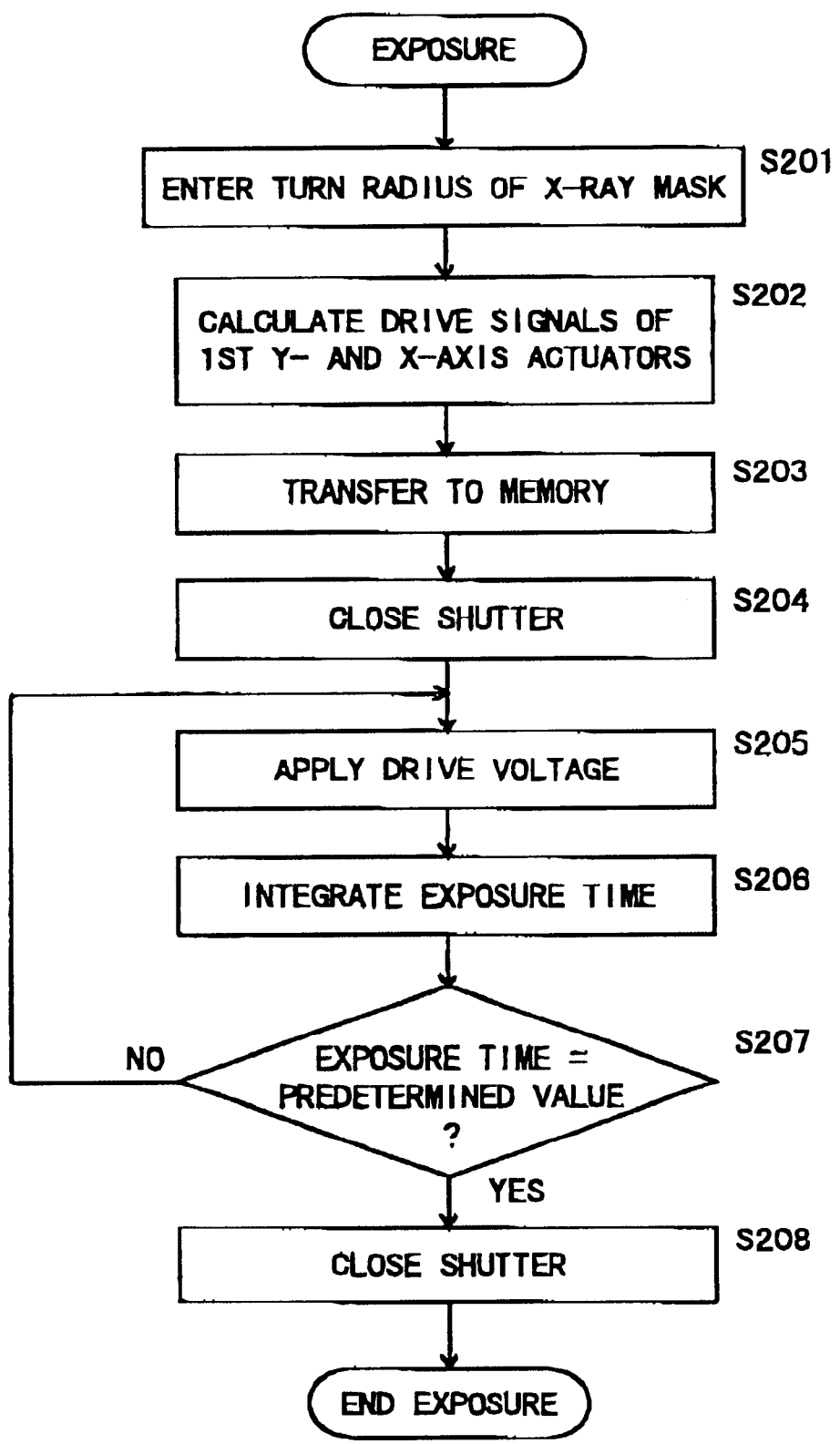
FIG. 28 is a flowchart showing a flow of exposure process performed by the processing device of the second embodiment.

Description will be given on the exposure process by the processing device of the second embodiment. FIG. 28 is a flowchart showing a flow of the exposure process performed by the processing device of the second embodiment. In the exposure process, a radius of the turn range of X-ray mask 32 is entered via input portion 6 (step S201). In the second embodiment, the turn range radius of X-ray mask 32 is 80 $\mu$m in radius, and therefore this value is entered. Based on the entered turn range radius of X-ray mask 32, main controller 5 calculates the drive signals for driving the second Y-axis actuator and second X-axis actuator. These drive signals are formed of two sinusoidal waves, which have the same amplitude, the same period and different phases shifted by 90 degrees from each other. The calculated drive signals are transferred to the memory of stage controller 4, and are stored therein (step S203).

In accordance with the instruction by the main controller, shutter 9 opens (step S204). Thereby, the X-rays of SR light emitted from SR light source 1 enter exposure chamber 2 to expose the resist of processing material 20.

Stage controller 4 reads out the drive signals stored in the memory, and converts them into analog signals. The drive voltages are applied to the first Y-axis actuator, first X-axis actuator, second X-axis actuator and second Y-axis actuator in mask moving mechanism 33. Thereby, X-ray mask 32 moves along a circle on a plane parallel to the resist of processing material 20, and also oscillates within the predetermined range on the plane parallel to the resist of processing material 20.

Main controller 5 measures the time length from opening of shutter 9 by a timer arranged therein (step S206), and determines whether the measured exposure time reaches a predetermined value or not (step S207). The operations in steps S205 and S206 are repeated until the measured exposure time reaches the predetermined value. When the measured exposure time reaches the predetermined value, shutter 0 closes in accordance with the instruction by main controller 5 so that the exposure ends.

The exposure time will now be described. The X-rays passed through the transparent opening of X-ray mask 32 has the intensity expressed by I·T where I (W·m−2) represents the intensity of X-rays emitted from SR light source 1, and T represents the transmittance of the transparent opening of X-ray mask 32. In this embodiment, dose monitor 10 monitors the intensity I of the X-rays of SR light emitted by SR light source 1. The transmittance T of the transparent opening of X-ray mask 32 is constant throughout the transparent opening.

Exposure amount E on the irradiation region, where the resist of processing material 20 is irradiated with the X-rays passed through the transparent opening of X-ray mask 32, can be expressed by the following formula (1), where t represents the time:

$$E = \int ITdt \tag{1}$$

Accordingly, the exposure time can be obtained as the integrated value of the time until the exposure amount reaches the predetermined value, based on intensity I of the X-rays, which are emitted by SR light source 1 and are monitored by dose monitor 10, and transmittance T of the transparent opening of X-ray mask 32.

Alternatively, the X-ray intensity may be measured by dose monitor 10 before the processing, and the intensity of X-rays varying with time may be estimated from the measured results and the attenuation characteristics of the X-rays emitted from SR light source 1. Thereby, the exposure amount may be determined based on the estimated X-ray intensity.

During the exposure by the processing device, stage controller 4 sends an instruction to reciprocating mechanism 34, and sample holder 31 reciprocates in direction X at a speed of 1 mm/second.

After the exposure, the resist (PMMA) of processing material 20 is developed. The development is performed at 40° C. for 120 minutes with developer and stopper solutions of the following compositions.

(1) The developer solution is GC developer containing, by volume, 60% of 2-(2-Butoxvethoxy) ethanol, 20% of morpholine, 5% of 2-Aminoethanol and 15% of water.

(2) The stopper solution contains, by volume, 80% of 2-(2-Butoxvethoxy) ethanol and 20% of water.

Using the resist (EMMA) of processing material 20 thus developed as a base, the electro-casting is performed so that a part made of metal can be obtained. Using the metal part thus prepared as a die, molding of resin or the like is performed for producing parts of required configuration. These manufacturing processes are similar to those in the conventional LIGA method.

In the processing device of the second embodiment, as described above, X-ray mask 32 is moved during the exposure such that the exposure distribution of the resist of processing material 20 may correspond to the intended processing configuration. Therefore, the resist of processing material 20 can be processed into the three-dimensional configuration having portions of different processed configuration.

Since X-ray mask 32 is oscillated in directions X and Y during the exposure, the error in configuration of transparent opening 1103 of X-ray mask 32 can be averaged over the region subjected to the exposure, and it is possible to suppress an influence, which may be exerted by the error in configuration of transparent opening 1103 on the processed configuration.

[Third Embodiment]

Description will now be given on a processing device of a third embodiment for producing a processing configuration having different processing depths. A processing principle of the processing device of the third embodiment is as follows. Although the actual exposure is performed on a two-dimensional range. For simplicity reason, however, the following description will be given on the exposure on a one-dimensional range.

FIGS. 29A and 29B show a relationship between the intensity distribution of the transparent openings, which have different areas, respectively, of the X-ray mask in the third embodiment, and the exposure amounts of the respective transparent openings. FIG. 29A shows an intensity distribution of the circular transparent openings having diameters of a1 and a2, respectively.

FIG. 29B shows an exposure distribution, which is achieved by rapidly oscillating the transparent openings exhibiting the intensity distribution of X-rays shown in FIG. 29A within a range D. The X-rays passed through the transparent opening of a1 in diameter and the X-rays passed through the transparent opening of a2 in diameter are applied to ranges D in an averaged state. Since the diameter a2 is larger than diameter a1, the exposure amount of the X-rays passed through the transparent opening of a2 in diameter is larger than the exposure amount of the X-rays passed through the transparent opening of a1 in diameter. By forming the plurality of transparent openings of different areas in X-ray mask 32, and oscillating X-ray mask 32 within the predetermined range, processing material 20 can be processed into the configuration having different processing depths, respectively.

Figure 30:
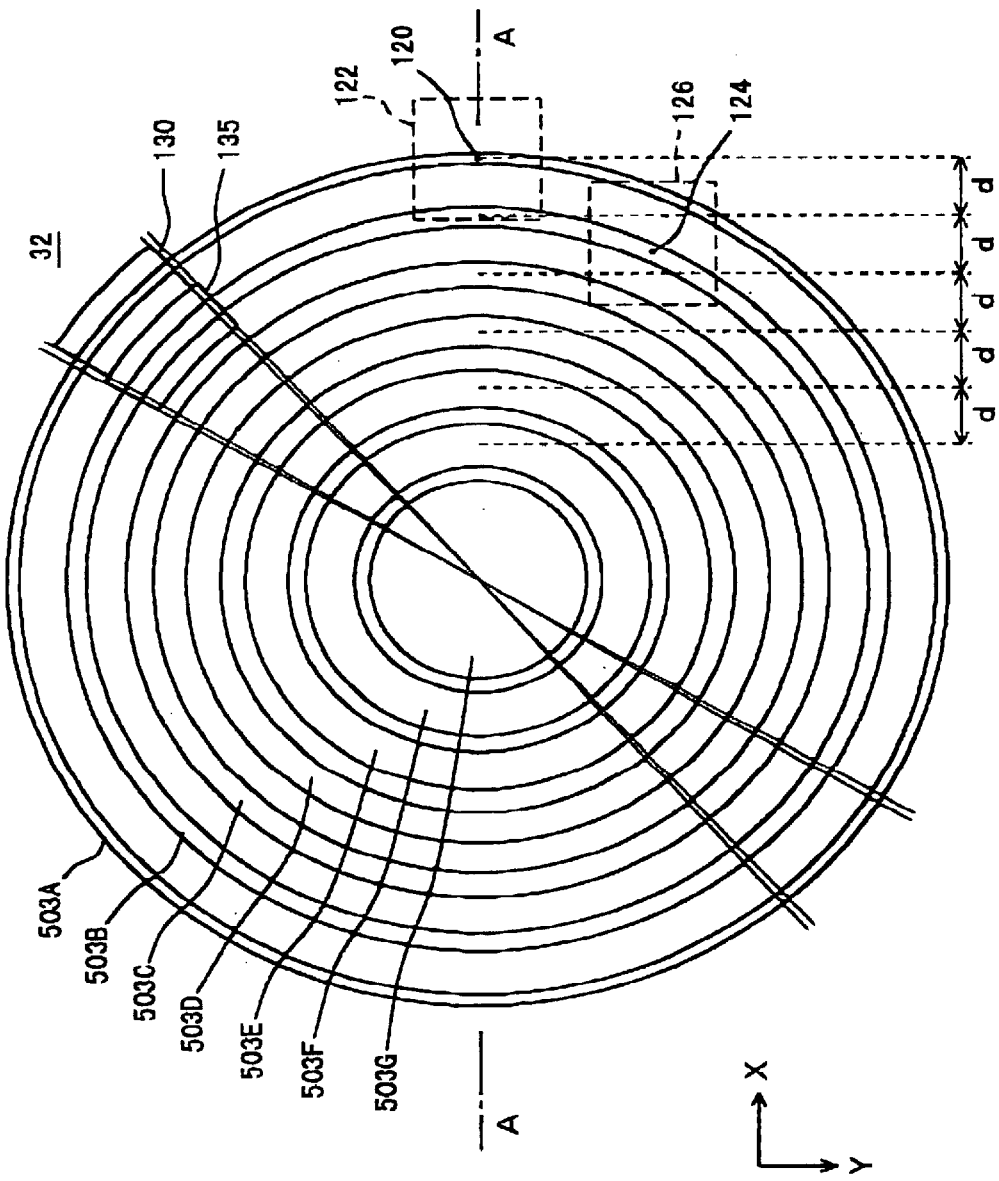
FIG. 30 is a plan showing a portion of the X-ray mask used in the third embodiment.

Description will now be given on an example, in which a microlens array is produced on the foregoing principle. FIG. 30 is a plan showing a portion of X-ray mask 32 used in the third embodiment. Referring to FIG. 30, X-ray mask 32 is provided with seven transparent openings 503A–503G. All the boundaries between transparent openings 503A–503G are formed of concentric circles, respectively. The concentric circles extending through centers in the radial direction of respective transparent openings 503A–503F have radii, each of which is different by d from the radius of the neighboring circle. Sections of transparent openings 503A–503G taken along line A—A in FIG. 30 have radial lengths, each of which is shorter than that of the section of the radially inner opening, and therefore transparent opening 503A has the shortest length.

Figure 31A:
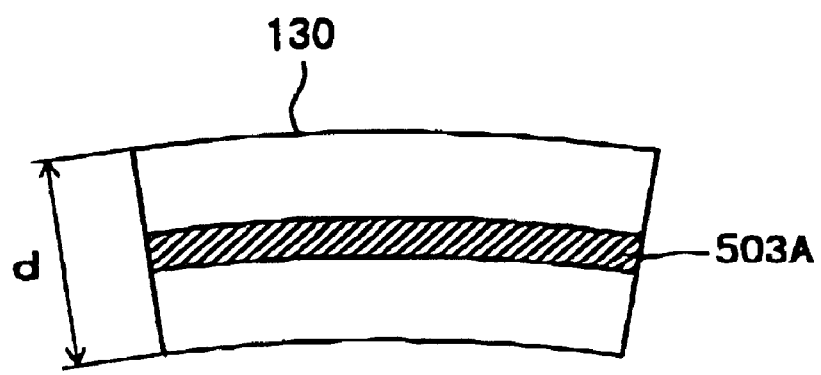
FIGS. 31A and 31B show, on an enlarged scale, unit regions in FIG. 30.
Figure 31B:
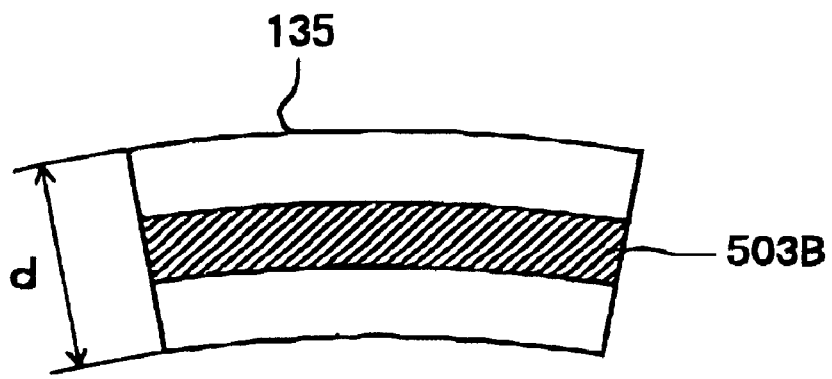

FIGS. 31A and 31B show, on an enlarged scale, unit regions 130 and 135 shown in FIG. 30. Unit regions 130 and 135 are defined between the concentric circles and between the straight lines extending through the center of the concentrical circles, and have the same area. In this embodiment, the unit region has a length of d in the diametral direction of the concentric circles. A rate of an area of transparent portion 503A in unit region 130 is different from the rate of an area of transparent opening 503B in unit region 135. In the direction of the straight line extending through the center of the concentric circles, transparent portion 503A has a shorter length than transparent portion 503B. Therefore, the rate of area of transparent portion 503A in the unit region is smaller than that of transparent portion 503B in the unit region.

Figure 32:
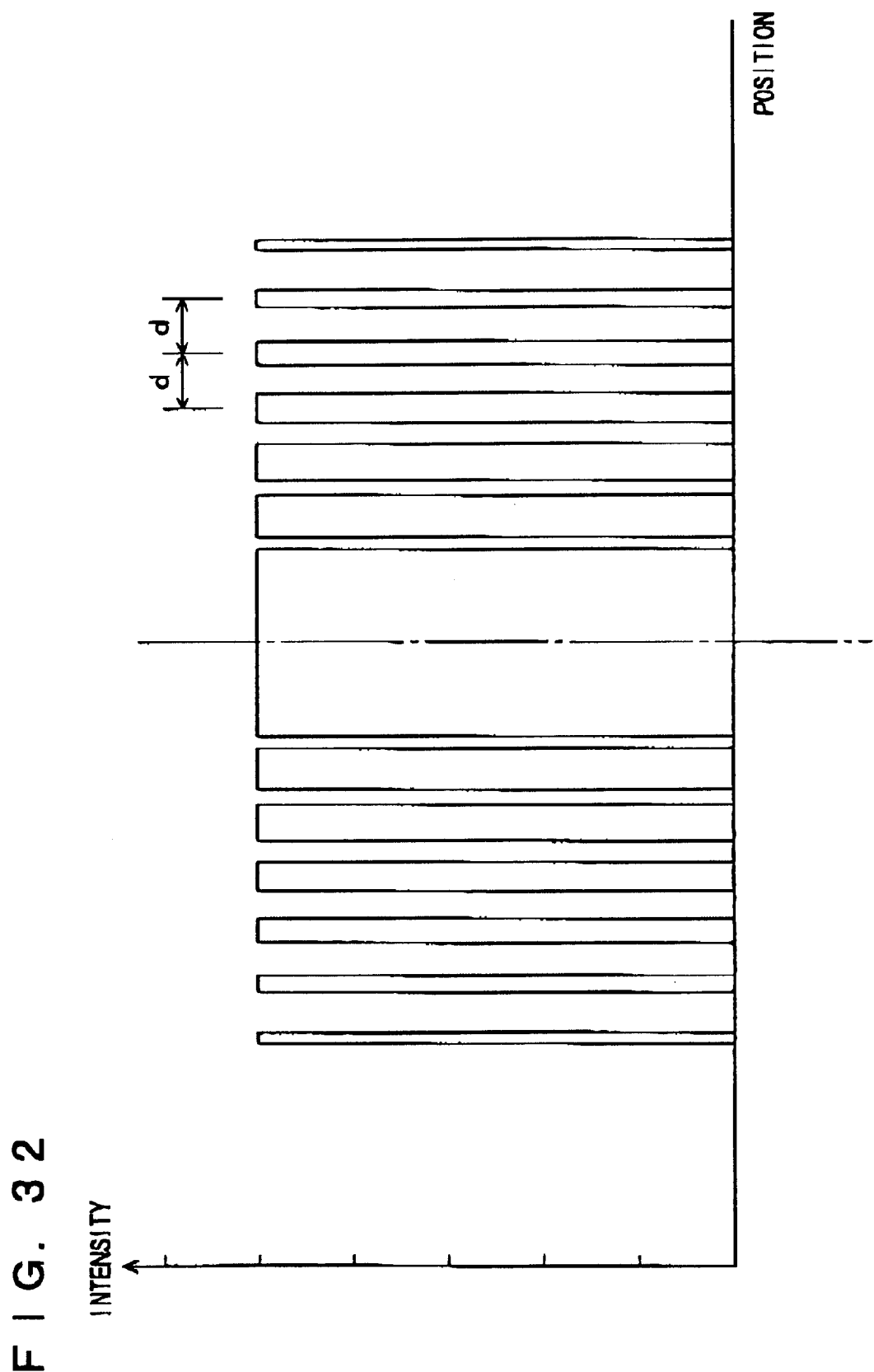
FIG. 32 shows an intensity distribution of X-rays passed through transparent openings on line A—A in FIG. 30.

FIG. 32 shows an intensity distribution of X-rays passed through transparent openings 503A–503G on the section taken along line A—A in FIG. 30. Referring to FIG. 32, since transparent openings 503A–503G have the same transmittance, the X-rays passed through each of transparent openings 503A–503G have the same intensity as those passed through the other openings On the section taken along line A—A, each of transparent openings 503A–503G has a width smaller than the opening in the radially inner position, and therefore transparent opening 503A in the radially outer end has the smallest length.

In the processing device of the third embodiment, X-ray mask 32 shown in FIG. 30 oscillates in direction X with an amplitude of d, and also oscillates in direction Y with an amplitude of d. For oscillating X-ray mask 32 in direction X with the amplitude of d and in direction Y with the amplitude of d, the triangular waveforms shown in FIGS. 24 and 25 are applied to the second Y-axis actuator and the second X-axis actuator. The voltage is not applied to first Y-axis actuator 332 and first X-axis actuator 335. Therefore, X-ray mask 32 is moved only by the second Y-axis actuator and the second X-axis actuator.

When X-ray mask 32 moves in directions X and Y with the amplitude of d, the resist of processing material 20 is exposed within the predetermined range with the X-rays passed through transparent openings 503A–503G of X-ray mask 32. Referring to FIG. 30, a minute region 120 of transparent opening 503A moves in a region 122 on the resist of processing material 20. Likewise, a minute region 124 of transparent opening 503B moves in a region 126 on the resist of processing material 20. In this operation, the X-ray passed through transparent opening 503A is emitted to achieve the uniform exposure amount in region 122. Likewise, the X-rays passed through transparent opening 503B is emitted to achieve the uniform exposure amount in region 126. The exposure amount of the X-rays passed through transparent opening 503A in region 122 is smaller than the exposure amount of the X-rays passed through transparent opening 503B in region 126. Therefore, the processing amount in region 122 is smaller than processing amount in region 126.

Figure 33:
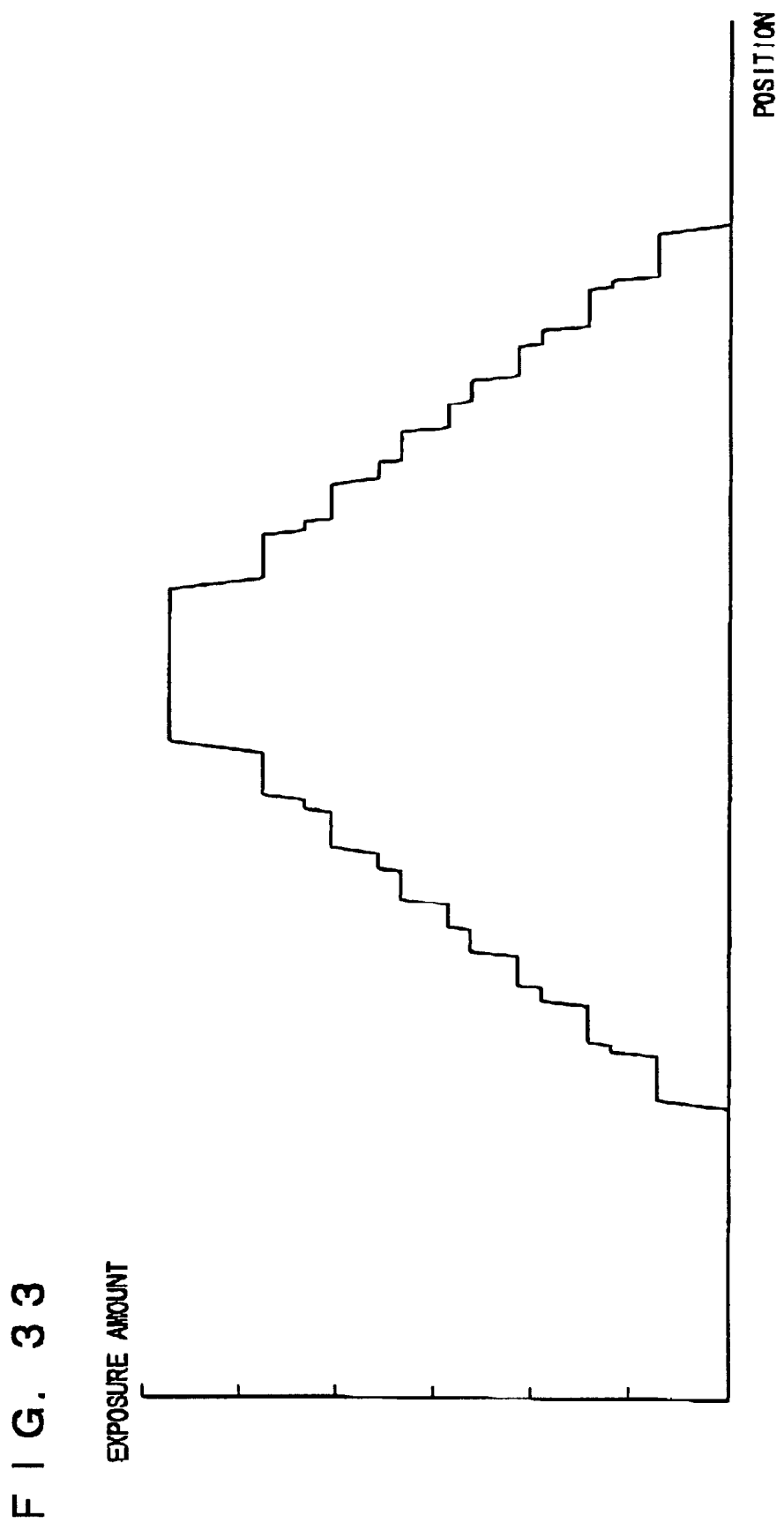
FIG. 33 shows an exposure amount on an arbitrary section of a material processed by oscillating the X-ray mask having the transparent openings shown in FIG. 30 with an amplitude d in accordance with a triangular wave shown in FIGS. 24 and 25.

FIG. 33 shows the exposure amount on an arbitrary section of the processing material which is achieved by oscillating X-ray mask 32 having the transparent openings shown in FIG. 30 with amplitude d and the triangular waveforms shown in FIGS. 24 and 25. Referring to FIG. 33, the exposure amount is large in the portion which is exposed to the X-rays passed through transparent opening 503G, and the exposure amount is small in the portion which is exposed to the X-rays passed through transparent opening 503A in the outermost position.

As described above, X-ray mask 32 having the transparent openings shown in FIG. 30 is used, whereby the three-dimensional configuration having partially different processing amounts can be produced by performing the exposure only one time.

In the third embodiment, the development is performed with developer solution and stopper solution of the compositions already described in connection with the second embodiment.

The processing devices of the second and third embodiments have been described in connection with the case where PMMA is used as the resist. However, PTFE (polytetrafluoroethylene) may be used instead of PMMA. If Teflon is used, direct processing (direct removal) with the X-rays of SR light can be performed. Accordingly, development is not necessary.

In the second and third embodiments, X-ray mask 32 is moved or oscillated. Alternatively, X-ray mask 32 may be fixed, and processing material 20 may be moved or oscillated. Both X-ray mask 32 and processing material 20 may be moved or oscillated.

The first, second and third embodiments have been described in connection with the processing using the X-rays. However, the invention is not restricted to the processing with the X-rays, and may be applied to the processing using ultraviolet light or light of a shorter wavelength than the ultraviolet light.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A processing device of processing a material by irradiating said material with ultraviolet light or light of a shorter wavelength than the ultraviolet light to remove said material, or to change physical or chemical properties of said material, comprising:

a light source for emitting the ultraviolet light or the light of the shorter wavelength than the ultraviolet light;

a mask having a transparent portion of a predetermined configuration for passing the light emitted from said light source;

an input portion for entering a processing configuration formed of a position on a plane of said material and a processing amount;

a memory for storing a relationship between the exposure amounts of said material and the processing amounts;

a converter for converting the processing configuration entered via said input portion into an effective exposure amount distribution formed of positions on said material plane and the exposure amounts in accordance with the relationship between the exposure amounts and the processing amounts stored in said memory;

a calculator for calculating a movement pattern for moving on said material plane an irradiation region for irradiation of said material with the light passed through said transparent portion based on said effective exposure amount distribution and the configuration of said transparent portion such that the exposure amount distribution of said material forms said effective exposure amount distribution; and a moving mechanism for moving said mask and said material relatively to each other in accordance with said calculated movement pattern.

2. The processing device according to claim 1, further comprising: a measuring portion for measuring an intensity of the light emitted from said light source, wherein said moving mechanism includes a detector for detecting an amount of the exposure amount of said irradiation region based on the intensity measured by said measuring portion.

3. The processing device according to claim 1, wherein said calculator includes:

a Fourier transformation portion for performing Fourier transformation on said effective exposure amount distribution and the transmittance distribution of said mask, and a Fourier inverse transformation portion for performing Fourier inverse transformation on a result obtained by dividing said effective exposure amount distribution subjected to the Fourier transformation by the transmittance distribution of said mask subjected to the Fourier transformation.

4. The processing device according to claim 3, further comprising:

removing means for removing a high-frequency component from the result obtained by dividing said effective exposure amount distribution subjected to the Fourier transformation by the transmittance distribution of said mask subjected to the Fourier transformation.

5. The processing device according to claim 3, wherein said Fourier inverse transformation portion performs the Fourier inverse transformation using a predetermined value predetermined for a value lower than a predetermined threshold if the result obtained by the Fourier transformation of said transmittance distribution of said mask includes said value lower than said predetermined threshold.

6. The processing device according to claim 3, wherein said Fourier inverse transformation portion adds a value larger than an absolute value of a negative value to the whole result of said Fourier inverse transformation if the result of the Fourier inverse transformation includes said negative value.

7. The processing device according to claim 1, wherein said moving mechanism causes movement such that at least a portion of the movement path of said irradiation region with respect to said material includes a straight line.

8. The processing device according to claim 1, wherein said moving mechanism causes movement such that at least a portion of the movement path of said irradiation region with respect to said material includes a circular portion.

9. The processing device according to claim 1, wherein said movement pattern is represented by the exposure amounts in the respective positions on said material plane in said irradiation region, and said moving mechanism moves a plurality of divided movement patterns formed by dividing said movement pattern based on the exposure amount such that said plurality of divided movement patterns are moved independently of each other.

10. The processing device according to claim 1, wherein said moving mechanism performs the control by repeating the state for stopping said irradiation region on said material plane and the state for moving said irradiation region, and achieves, in said state for moving said irradiation region, a moving speed not affecting removal of said material or change in physical or chemical properties of said material.

11. The processing device according to claim 1, wherein said movement pattern is represented by the exposure amounts in the respective positions on said material plane in said irradiation region, and said moving mechanism performs the movement at a speed inversely proportional to the exposure amount corresponding to the position of said material plane in said irradiation region.

12. The processing device according to claim 1, further comprising:

an intercepting portion for intercepting the light coming from said light source, wherein said intercepting portion intercepts the light when said material is not to be exposed.

13. A processing method of processing a material by irradiating said material with ultraviolet light or light of a shorter wavelength than the ultraviolet light to remove said material, or to change physical or chemical properties of said material, comprising the steps of:

emitting the ultraviolet light or the light of the shorter wavelength than the ultraviolet light to an irradiation region of a predetermined configuration;

entering a processing configuration formed of a position on a plane of said material and a processing amount;

converting the entered processing configuration into an effective exposure amount distribution formed of the position on said material plane and the exposure amount in accordance with a relationship between the exposure amount of said material and said processing amount; calculating a movement pattern for moving on said material plane said irradiation region based on said effective exposure amount distribution and the configuration of said irradiation region such that the exposure amount distribution of said material forms said effective exposure amount distribution; and moving said irradiation region and said material relatively to each other in accordance with the calculated movement pattern.

14. A processing device of processing a material by irradiating said material with ultraviolet light or light of a shorter wavelength than the ultraviolet light to remove said material, or to change physical or chemical properties of said material, comprising:

a light source for emitting the ultraviolet light or the light of the shorter wavelength than the ultraviolet light;

a mask having a transparent portion of a predetermined configuration for passing the light emitted from said light source;

a moving mechanism for moving said mask and said material relatively to each other in accordance with a movement pattern determined based on a processing configuration of said material; and an oscillating mechanism for oscillating said mask and said material relatively to each other for oscillating a region for irradiation of said material with the light passed through said transparent portion, wherein a speed of the oscillation by said oscillating mechanism is higher than a speed of movement by said moving mechanism.

15. The processing device according to claim 14, wherein said oscillating mechanism oscillates said mask and said material relatively to each other with an amplitude determined based on an error contained in the configuration of said transparent portion.

16. The processing device according to claim 14, wherein said oscillating mechanism causes the oscillations in a first direction and a second direction crossing said first direction, and the period of the oscillation in said first direction is different from that of the oscillation in said second direction.

17. The processing device according to claim 16, wherein the periods of said oscillations in said first and second directions are prime to each other.

18. A processing device of processing a material by irradiating said material with ultraviolet light or light of a wavelength shorter than the ultraviolet light to remove said material, or to change physical or chemical properties of said material, comprising:

a light source for emitting the ultraviolet light or the light of the shorter wavelength than the ultraviolet light;

a mask having a plurality of transparent portions for passing the light emitted from said light source; and an oscillating mechanism for oscillating said mask and said material relatively to each other for oscillating a plurality of regions for irradiation of said material with the light passed through said plurality of transparent portions, wherein said plurality of transparent portions include the transparent portion occupying a unit area at a rate different from those of the other transparent portions.

19. A processing method of processing a material by irradiating said material with ultraviolet light or light of a shorter wavelength than the ultraviolet light to remove said material, or to change physical or chemical properties of said material, comprising the steps of;

emitting the ultraviolet light or the light of the shorter wavelength than the ultraviolet light to an irradiation region of a predetermined configuration;

moving said irradiation region and said material relatively to each other in accordance with a movement pattern determined based on a processing configuration of said material; and oscillating said irradiation region and said material relatively to each other for oscillating said irradiation region on a plane of said material, wherein a speed of the oscillation in said oscillating step is higher than a speed of the movement in said moving step.

20. A processing method of processing a material by irradiating said material with ultraviolet light or light of a shorter wavelength than the ultraviolet light to remove said material, or to change physical or chemical properties of said material, comprising the steps of;

emitting the ultraviolet light or the light of the shorter wavelength than the ultraviolet light to a plurality of irradiation regions; and oscillating said plurality of irradiation regions and said material relatively to each other for oscillating said plurality of irradiation regions on a plane of said material, wherein said plurality of irradiation regions include the irradiation region occupying a unit area at a rate different from those of the other irradiation regions.

* * * * *